(12) United States Patent
Zhu et al.

(10) Patent No.: US 9,692,363 B2
(45) Date of Patent: Jun. 27, 2017

(54) RF POWER TRANSISTORS WITH VIDEO BANDWIDTH CIRCUITS, AND METHODS OF MANUFACTURE THEREOF

(71) Applicant: FREESCALE SEMICONDUCTOR, INC., Austin, TX (US)

(72) Inventors: Ning Zhu, Chandler, AZ (US); Damon G. Holmes, Scottsdale, AZ (US); Jeffrey K. Jones, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/919,511

(22) Filed: Oct. 21, 2015

(65) Prior Publication Data

US 2017/0117856 A1 Apr. 27, 2017

(51) Int. Cl.
  H03F 3/04 (2006.01)
  H03F 1/56 (2006.01)
  H03F 3/19 (2006.01)

(52) U.S. Cl.
  CPC ............... *H03F 1/565* (2013.01); *H03F 3/19* (2013.01); *H03F 2200/301* (2013.01); *H03F 2200/451* (2013.01)

(58) Field of Classification Search
  CPC ........................................................ H03F 3/04
  USPC ........................................ 330/302, 253, 153
  See application file for complete search history.

(56) References Cited

U.S. PATENT DOCUMENTS

| | | | |
|---|---|---|---|
| 3,434,070 A | 3/1969 | Bartnik et al. | |
| 3,908,105 A | 9/1975 | Schuler | |
| 3,908,185 A | 9/1975 | Martin | |
| 4,717,884 A | 1/1988 | Mitzlaff | |
| 5,066,925 A | 11/1991 | Freitag | |
| 5,625,528 A | 4/1997 | Devoe et al. | |
| 5,736,901 A | 4/1998 | Nakamura | |
| 5,808,527 A | 9/1998 | De Los Santos | |
| 6,072,211 A | 6/2000 | Miller et al. | |
| 6,072,238 A | 6/2000 | Viswanathan et al. | |
| 6,072,690 A | 6/2000 | Farooq et al. | |
| 6,081,160 A | 6/2000 | Custer et al. | |
| 6,222,425 B1 | 4/2001 | Okada et al. | |
| 6,507,101 B1 | 1/2003 | Morris | |
| 6,731,174 B2 | 5/2004 | Krvavac | |
| 6,822,321 B2 * | 11/2004 | Crescenzi, Jr. ......... | H01L 23/66 257/691 |

(Continued)

FOREIGN PATENT DOCUMENTS

CN 101296347 A 10/2008
CN 102340288 A 2/2012

(Continued)

OTHER PUBLICATIONS

Non-Final Office Action mailed Nov. 2, 2015 for U.S. Appl. No. 14/317,572, 10 pages.

(Continued)

*Primary Examiner* — Patricia T Nguyen
(74) *Attorney, Agent, or Firm* — Sherry W. Schumm

(57) ABSTRACT

Embodiments of RF amplifiers and packaged RF amplifier devices each include a transistor, an impedance matching circuit, and a video bandwidth circuit. The impedance matching circuit is coupled between the transistor and an RF I/O (e.g., an input or output lead). The video bandwidth circuit is coupled between a connection node of the impedance matching circuit and a ground reference node. The video bandwidth circuit includes a plurality of components, which includes an envelope inductor and an envelope capacitor coupled in series between the connection node and the ground reference node. The video bandwidth circuit further includes a first bypass capacitor coupled in parallel across one or more of the plurality of components of the video bandwidth circuit.

12 Claims, 7 Drawing Sheets

(56) References Cited

U.S. PATENT DOCUMENTS

| | | | |
|---|---|---|---|
| 7,029,971 | B2 | 4/2006 | Borland |
| 7,057,464 | B2 | 6/2006 | Bharj |
| 7,135,643 | B2 | 11/2006 | Van Haaster et al. |
| 7,368,668 | B2 | 5/2008 | Ren et al. |
| 7,372,334 | B2 | 5/2008 | Blair et al. |
| 7,412,007 | B1 | 8/2008 | Richley et al. |
| 7,564,303 | B2 | 7/2009 | Perugupalli et al. |
| 7,733,059 | B2 | 6/2010 | Yoshida |
| 8,030,763 | B2 | 10/2011 | Romero et al. |
| 8,253,495 | B2 | 8/2012 | Bouisse |
| 8,324,728 | B2 | 12/2012 | Tabrizi |
| 8,350,367 | B2 | 1/2013 | Chiu et al. |
| 8,611,459 | B2 * | 12/2013 | McCallister ...... H04L 25/03343 330/149 |
| 8,659,359 | B2 | 2/2014 | Ladhani et al. |
| 9,106,187 | B2 | 8/2015 | Ladhani et al. |
| 2005/0083723 | A1 | 4/2005 | Blednov et al. |
| 2007/0024358 | A1* | 2/2007 | Perugupalli ............ H01L 23/66 330/66 |
| 2007/0029662 | A1 | 2/2007 | Lee |
| 2007/0090515 | A1 | 4/2007 | Condie et al. |
| 2007/0158787 | A1 | 7/2007 | Chanchani |
| 2007/0273449 | A1* | 11/2007 | Wilson ...................... H03F 1/02 330/297 |
| 2008/0231373 | A1* | 9/2008 | Rahman .................. H01L 23/66 330/302 |
| 2008/0246547 | A1 | 10/2008 | Blednov |
| 2009/0130544 | A1 | 5/2009 | Chang et al. |
| 2010/0038111 | A1 | 2/2010 | Yabe et al. |
| 2011/0031571 | A1 | 2/2011 | Bouisse |
| 2011/0156203 | A1 | 6/2011 | Park |
| 2012/0019334 | A1 | 1/2012 | Hirai et al. |
| 2012/0146723 | A1 | 6/2012 | Blednov et al. |
| 2012/0154053 | A1* | 6/2012 | Blair ....................... H01L 23/66 330/278 |
| 2013/0033325 | A1* | 2/2013 | Ladhani ................ H03F 1/0288 330/277 |
| 2014/0022020 | A1 | 1/2014 | Aaen et al. |
| 2014/0070365 | A1 | 3/2014 | Viswanathan et al. |
| 2014/0077881 | A1 | 3/2014 | Wilson |
| 2014/0167855 | A1 | 6/2014 | Ladhani et al. |
| 2014/0167863 | A1 | 6/2014 | Ladhani et al. |
| 2014/0179243 | A1 | 6/2014 | Bouisse et al. |
| 2014/0225672 | A1* | 8/2014 | Wilson ..................... H03H 7/38 330/277 |
| 2014/0333385 | A1 | 11/2014 | Gutta et al. |
| 2015/0115893 | A1 | 4/2015 | Lee et al. |
| 2015/0235933 | A1 | 8/2015 | Ladhani et al. |
| 2015/0263681 | A1 | 9/2015 | Embar et al. |

FOREIGN PATENT DOCUMENTS

| | | |
|---|---|---|
| JP | 2007-285875 A | 11/2007 |
| JP | 2008-175804 A | 7/2008 |
| WO | 0182672 A1 | 11/2001 |
| WO | 2009130544 A1 | 10/2009 |
| WO | 2010038111 A1 | 4/2010 |

OTHER PUBLICATIONS

Non-Final Office Action mailed Apr. 11, 2016 for U.S. Appl. No. 14/942,419 11 pages.
Notice of Allowance mailed May 6, 2016 for U.S. Appl. No. 14/317,572 9 pages.
Kahn, "Multilayer Ceramic Capacitors—Materials and Manufacture", Technical Information, AVX, Sep. 5, 2000, 8 pages.
U.S. Appl. No. 14/316,484, filed Jun. 26, 2014, entitled "Radio Frequency Devices With Surface-Mountable Capacitors for Decoupling and Methods Thereof".
Non-Final Office Action mailed Jan. 4, 2013 for U.S. Appl. No. 12/746,793, 10 pages.
Non-Final Office Action mailed May 28, 2013 for U.S. Appl. No. 12/746,793, 9 pages.
Notice of Allowance mailed Oct. 10, 2013 for U.S. Appl. No. 12/746,793, 7 pages.
Non-Final Office Action mailed Jul. 7, 2014 for U.S. Appl. No. 14/185,291, 15 pages.
Notice of Allowance mailed Mar. 5, 2015 for U.S. Appl. No. 14/185,291, 7 pages.
Notice of Allowance mailed Oct. 29, 2014 for U.S. Appl. No. 14/185,291, 6 pages.
Non-Final Office Action mailed Aug. 11, 2014 for U.S. Appl. No. 14/185,382, 12 pages.
Non-Final Office Action mailed Dec. 29, 2014 for U.S. Appl. No. 14/185,382, 9 pages.
Notice of Allowance mailed May 29, 2015 for U.S. Appl. No. 14/185,382, 5 pages.
Notice of Allowance mailed Oct. 29, 2015 for U.S. Appl. No. 13/611,793, 9 pages.
Restriction Requirement mailed Oct. 25, 2013 for U.S. Appl. No. 13/611,793, 5 pages.
Non-Final Office Action mailed Dec. 6, 2013 for U.S. Appl. No. 13/611,793, 14 pages.
Final Office Action mailed Sep. 4, 2014 for U.S. Appl. No. 13/611,793, 14 pages.
U.S. Appl. No. 14/317,572, filed Jun. 27, 2014, entitled "Integrated Passive Device Assemblies for RF Amplifiers, and Methods of Manufacture Thereof".
U.S. Appl. No. 14/573,927, filed Dec. 17, 2014, entitled "Magnetically Coupled Load Modulation".
U.S. Appl. No. 14/919,990, filed Oct. 22, 2015, entitled "RF Amplifier Output Circuit Device With Integrated Current Path, and Methods of Manufacture Thereof".
U.S. Appl. No. 14/919,513, filed Oct. 21, 2015 entitled "RF Power Transistors With Impedance Matching Circuits, and Methods of Manufacture Thereof".
Extended European Search Report for Patent Appln. No. 16169901.2 (Oct. 4, 2016).
Notice of Allowance mailed Nov. 9, 2016 for U.S. Appl. No. 14/942,419 12 pages.
Notice of Allowance mailed Mar. 6, 2017 for U.S. Appl. No. 14/942,419 5 pages.
Final Office Action mailed Oct. 14, 2016 for U.S. Appl. No. 15/050,176 9 pages.
Non-Final Office Action mailed Apr. 22, 2016 for U.S. Appl. No. 15/050,176 9 pages.
Notice of Allowance mailed Feb. 13, 2017 for U.S. Appl. No. 15/050,176 7 pages.
Notice of Allowance mailed Nov. 2, 2016 for U.S. Appl. No. 14/919,513 7 pages.
Notice of Allowance mailed Apr. 19, 2017 for U.S. Appl. No. 15/050,176 8 pages.
Notice of Allowance mailed Apr. 21, 2017 for U.S. Appl. No. 14/942,419 11 pages.

\* cited by examiner

US 9,692,363 B2

RF POWER TRANSISTORS WITH VIDEO BANDWIDTH CIRCUITS, AND METHODS OF MANUFACTURE THEREOF

TECHNICAL FIELD

Embodiments of the subject matter described herein relate generally to packaged semiconductor devices, and more particularly to packaged, radio frequency (RF) semiconductor devices that include video bandwidth circuits.

BACKGROUND

A typical high power, radio frequency (RF) semiconductor device may include one or more input leads, one or more output leads, one or more transistors, bondwires coupling the input lead(s) to the transistor(s), and bondwires coupling the transistor(s) to the output lead(s). The bondwires have significant inductive reactance at high frequencies, and such inductances are factored into the design of input and output impedance matching circuits for a device. In some cases, input and output impedance matching circuits may be contained within the same package that contains the device's transistor(s). More specifically, an in-package, input impedance matching circuit may be coupled between a device's input lead and a control terminal (e.g., the gate) of a transistor, and an in-package, output impedance matching circuit may be coupled between a current conducting terminal (e.g., the drain) of a transistor and a device's output lead.

Packaged RF semiconductor devices are available that have decent performance when used in relatively narrow-band applications with relatively low instantaneous signal bandwidth (ISBW) (e.g., ISBW of 150 megahertz (MHz) or less). However, increased ISBW (e.g., ISBW of 200 MHz or more) is becoming a major requirement for RF communication amplifiers (e.g., RF communication infrastructure amplifiers). This requirement stems from the fact that larger information download rates per second are becoming a significant enablement feature. Thus, trends in the RF communication industry include development of packaged RF semiconductor devices with increasingly wideband operation and relatively high ISBW.

Designing RF amplifier devices with high ISBW is challenging. For example, the ISBW of a device may be directly affected by the low frequency resonance (LFR) caused by interaction between the device's bias feeds and output circuits that are electrically connected between a device's transistor(s) and its output lead(s). More particularly, inductances of bondwires that interconnect various output circuit components may limit the LFR of the device.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
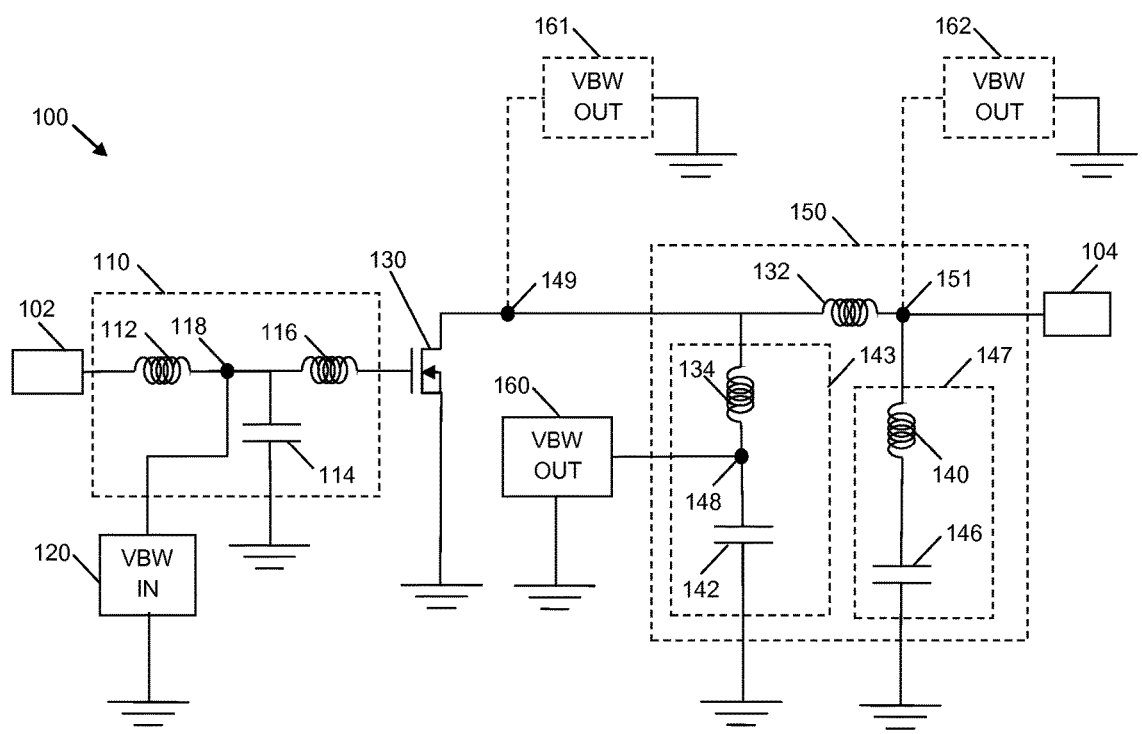
FIG. 1 is a schematic diagram of an RF amplifier with input and output impedance matching and video bandwidth circuits, in accordance with an example embodiment.

An output impedance matching circuit in a conventional RF power amplifier device may include, among other things, a shunt circuit that functions as a high-pass matching stage. For example, a conventional shunt circuit may include an inductor (herein "shunt inductor" or $L_{shunt}$) and a capacitor (herein "shunt capacitor" or $C_{shunt}$) coupled in series between a current conducting terminal (e.g., the drain) of the transistor and a ground reference node. In a conventional device, an "RF cold point" is located between the shunt inductor and the shunt capacitor. Essentially, the RF cold point is a node that may function as a virtual ground reference voltage for RF electrical signals. If the RF cold point were ideal, then during device operation, little or no RF energy at the power amplifier's center operating frequency would be present at the RF cold point. However, the RF cold point in a conventional shunt circuit is not ideal, and some RF energy at the center frequency is present at the RF cold point during operation.

To improve the low frequency resonance (LFR) of a device, and thus to increase the device's instantaneous signal bandwidth (ISBW), a device also may include an "envelope frequency termination circuit" (or "video bandwidth circuit") in the output impedance matching circuit, although a video bandwidth circuit also could be included in an input impedance matching circuit, as well. Essentially, a properly designed video bandwidth circuit is configured to have low impedance at envelope frequencies, so that the envelope current may readily pass through the video bandwidth circuit to ground, rather than being conveyed to the device's output lead. In a conventional device, the video bandwidth circuit is electrically coupled to the RF cold point (e.g., to a node between the shunt inductance and capacitance) so that the video bandwidth circuit is likely to be exposed only to a minimal amount of RF energy near the center operating frequency.

A typical video bandwidth circuit may include a series combination of an inductance (herein "envelope inductor" or $L_{env}$), a resistance (herein "envelope resistor" or $R_{env}$), and a capacitance (herein "envelope capacitor" or $C_{env}$) coupled between the RF cold point and the ground reference node. The envelope resistor is advantageous in that it may dampen very low frequency resonance of the envelope capacitor. However, significant current flow through the envelope resistor is not desirable at higher frequencies (e.g., in proximity to the center operating frequency of the device), as the associated power dissipation may manifest itself as a reduction in the drain efficiency of the device. Further, if the power dissipation becomes too high, it may compromise the integrity of the envelope resistor.

In a conventional device, due to imperfection of the RF cold point, a reasonably significant amount of RF energy at the center operating frequency may be present at the RF cold point during operation, and the associated RF current may convey into the video bandwidth circuit and be dissipated by the envelope resistor. In some devices, a relatively high envelope inductor value may be selected to present a high impedance to RF signals, thus deflecting RF current from propagating through the video bandwidth circuit. A relatively large envelope inductor may result in a reduction in the power dissipation in the envelope resistor, thus potentially increasing drain efficiency. However, such a relatively large envelope inductor also may increase the video bandwidth circuit's baseband impedance, which could degrade the linearization capability using digital pre-distortion, and/or lower the LFR of the device thereby degrading the device's ISBW. To achieve high linearization, the baseband impedance up to the LFR should be relatively low (e.g., 1.0 ohm or less). Conventional devices fail to achieve such a low baseband impedance up to the LFR.

Embodiments of the inventive subject matter include RF amplifiers and packaged semiconductor devices (e.g., packaged RF power transistor devices) that include a modified video bandwidth circuit that better deflects RF current near the center operating frequency, and/or that routes the RF current around the envelope resistor. In various embodiments, this is achieved by including one or more bypass capacitors, $C_{para}$, in the video bandwidth circuit. The various video bandwidth circuit embodiments may still achieve relatively low baseband impedance (e.g., 1.0 ohm or less up to the LFR of the device). Further, without significant RF current passing through the envelope resistor, the device may avoid a drain efficiency performance penalty due to undesirable RF power dissipation that may otherwise occur in the envelope resistor. More specifically, with RF current being better deflected or re-routed by the video bandwidth circuit, less power may be dissipated through the envelope resistor. Further, less RF current flowing through the envelope resistor may reduce the potential for compromising the envelope resistor due to excessive power dissipation. Finally, the modified video bandwidth circuit may be realized with a relatively low envelope inductance, and thus reduced baseband impedance up to the LFR.

FIG. 1 is a schematic diagram of an RF power amplifier device 100. Device 100 includes an input lead 102, an input impedance matching circuit 110, a transistor 130, an output impedance matching circuit 150, input-side and/or output side video bandwidth circuits 120, 160 (or 161 or 162), and an output lead 104, in an embodiment. Each of the input and output leads 102, 104 may be more generally referred to as an "RF input/output (I/O)." As will be discussed in more detail later, only one video bandwidth circuit 120, 160 (or 161 or 162) would likely be included in an embodiment of an RF power amplifier device. However, multiple video bandwidth circuits 120, 160, 161, 162 are shown in FIG. 1 to indicate some possible nodes to which a video bandwidth circuit may be coupled.

The input-side video bandwidth circuit 120 and the input impedance matching circuit 110 may be referred to collectively as an "input circuit." Similarly, the output-side video bandwidth circuit 160 and the output impedance matching circuit 150 may be referred to collectively as an "output circuit." Although transistor 130 and various elements of the input and output impedance matching circuits 110, 150 and the video bandwidth circuits 120, 160 are shown as singular components, the depiction is for the purpose of ease of explanation only. Those of skill in the art would understand, based on the description herein, that transistor 130 and/or certain elements of the input and output impedance matching circuits 110, 150 and the video bandwidth circuits 120, 160 each may be implemented as multiple components (e.g., connected in parallel or in series with each other), and examples of such embodiments are illustrated in the other Figures and described later. For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 130 and various elements of the input and output impedance matching circuits 110, 150 and the video bandwidth circuits 120, 160, below, thus are not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically positioned to span between the exterior and the interior of the device's package. Input impedance matching circuit 110 and video bandwidth circuit 120 are electrically coupled between the input lead 102 and a first terminal of transistor 130 (e.g., the gate), which is also located within the device's interior. Similarly, output impedance matching circuit 150 and video bandwidth circuit 160 are electrically coupled between a second terminal of transistor 130 (e.g., the drain) and the output lead 104.

According to an embodiment, transistor 130 is the primary active component of device 100. Transistor 130 includes a control terminal and two current conducting terminals, where the current conducting terminals are spatially and electrically separated by a variable-conductivity channel. For example, transistor 130 may be a field effect transistor (FET) (such as a metal oxide semiconductor FET (MOSFET)), which includes a gate (control terminal), a drain (a first current conducting terminal), and a source (a second current conducting terminal). Alternatively, transistor 130 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 130 is coupled to the input impedance matching circuit 110 and the video bandwidth circuit 120, the drain of transistor 130 is coupled to the output impedance matching circuit 150 and the video bandwidth circuit 160, and the source of transistor 130 is coupled to ground (or another voltage reference). Through the variation of control signals provided to the gate of transistor 130, the current between the current conducting terminals of transistor 130 may be modulated.

Input impedance matching circuit 110 is coupled between the input lead 102 and the control terminal (e.g., gate) of the transistor 130. Input impedance matching circuit 110 is configured to raise the impedance of device 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface).

According to an embodiment, input impedance matching circuit 110 includes two inductive elements 112, 116 (e.g., two sets of bondwires) and a shunt capacitor 114. A first inductive element 112 (e.g., a first set of bondwires) is coupled between input lead 102 and a first terminal of capacitor 114, and a second inductive element 116 (e.g., a second set of bondwires) is coupled between the first terminal of capacitor 114 and the control terminal of transistor 130. The second terminal of capacitor 114 is coupled to ground (or another voltage reference). The combination of inductive elements 112, 116 and shunt capacitor 114 functions as a low-pass filter. According to an embodiment, the series combination of inductive elements 112, 116 may have a value in a range between about 50 picohenries (pH) to about 3 nanohenries (nH), and shunt capacitor 114 may have a value in a range between about 5 picofarads (pF) to about 80 pF.

According to an embodiment, an input-side video bandwidth circuit 120 is coupled to a connection node (e.g., node 118) of the input impedance matching circuit 110. In FIG. 1, the connection node 118 corresponds to the first terminal of capacitor 114, although the input-side video bandwidth circuit 120 may be coupled to another point in the input circuit, as well. As will be discussed in more detail in conjunction with FIGS. 2-5, later, the input-side video bandwidth circuit 120 may have any of a number of different circuit configurations, in various embodiments. However, a common aspect of each of the video bandwidth circuit embodiments is that the video bandwidth circuit includes one or more bypass capacitors, $C_{para}$, coupled in parallel across one or more of the other components of the video bandwidth circuit.

As will be described in more detail later in conjunction with FIG. 8, various embodiments of RF amplifier devices may include at least one input-side integrated passive device (IPD) assembly (e.g., IPD assembly 800, FIG. 8), which includes portions of the input circuit 110 and the input-side video bandwidth circuit 120. More specifically, each IPD assembly may include a semiconductor substrate with one or more integrated passive components. In a particular embodiment, each input-side IPD assembly may include shunt capacitor 114, and portions of video bandwidth circuit 120. In other embodiments, some or all of these portions of the input impedance matching and video bandwidth circuit 110, 120 may be implemented as distinct/discrete components or as portions of other types of assemblies (e.g., a low-temperature co-fired ceramic (LTCC) device, a small PCB assembly, and so on). In still other embodiments, some or all of these portions of the input impedance matching and video bandwidth circuits 110, 120 may be coupled to and/or integrated within the semiconductor die that includes transistor 130. The below, detailed description of embodiments that include IPD assemblies should not be taken to limit the inventive subject matter, and the term "passive device substrate" means any type of structure that includes a passive device, including an IPD, a LTCC device, a transistor die, a PCB assembly, and so on.

Output impedance matching circuit 150 is coupled between the first current conducting terminal (e.g., drain) of transistor 130 and the output lead 104. Output impedance matching circuit 150 is configured to match the output impedance of device 100 with the input impedance of an external circuit or component (not shown) that may be coupled to output lead 104. According to an embodiment, output impedance matching circuit 150 includes three inductive elements 132, 134, 140 and two capacitors 142, 146. A first inductive element 132 (e.g., a third set of bondwires), which may be referred to herein as a "series inductor" or $L_{series}$, is coupled between the first current conducting terminal (e.g., drain) of transistor 130 and the output lead 104. A second inductive element 134 (e.g., a fourth set of bondwires, which may be referred to herein as a "shunt inductor" or $L_{shunt}$, is coupled between the first current conducting terminal of transistor 130 and a node 148, which corresponds to an RF cold point node, in an embodiment. Finally, a third inductive element 140 (e.g., a fifth set of bondwires), which may be referred to herein as an "low-pass matching inductor," is coupled between the output lead 104 and a first terminal of a second capacitor 146, which may be referred to herein as an "low-pass matching capacitor." Second terminals of the shunt and low-pass matching capacitors 142, 146 are coupled to ground (or to another voltage reference), in an embodiment.

The shunt inductor 134 and the shunt capacitor 142 are coupled in series between a current conducting terminal of transistor 130 and ground, and this combination of impedance matching elements functions as a first (high-pass) matching stage. Accordingly, the combination of shunt inductor 134 and shunt capacitor 142 may be referred to herein as a high-pass matching circuit 143. According to an embodiment, shunt inductor 134 may have a value in a range between about 100 pH to about 3 nH, and shunt capacitor 142 may have a value in a range between about 50 pF to about 500 pF, although these components may have values outside of these ranges, as well.

An RF cold point 148 is present at the node between the shunt inductor 134 and the shunt capacitor 142. As discussed previously, the RF cold point 148 represents a low impedance point in the circuit for RF signals. According to an embodiment, an output-side video bandwidth circuit 160 is coupled between the RF cold point 148 and the ground reference node. As indicated in FIG. 1, output-side video bandwidth circuits 161, 162 may be coupled to other connection nodes (e.g., nodes 149, 151, respectively) in the output circuit, as well. Again, as will be discussed in more detail in conjunction with FIGS. 2-5, later, the output-side video bandwidth circuit 160 (or 161 or 162) may have any of a number of different circuit configurations, in various embodiments.

Further, as will be described in more detail later in conjunction with FIGS. 9 and 10, various embodiments of RF amplifier devices may include at least one output-side IPD assembly (e.g., IPD assembly 900 or 1000, FIGS. 9, 10), which includes portions of the output circuit 150 and the output-side video bandwidth circuit 160 (or 161 or 162).

Again, each IPD assembly may include a semiconductor substrate with one or more integrated passive components. In a particular embodiment, each output-side IPD assembly may include RF cold point 148, shunt capacitors 142 and/or 146, and portions of video bandwidth circuit 160 (or 161 or 162). In other embodiments, some or all of these portions of the output impedance matching and video bandwidth circuits 150, 160 may be implemented as distinct/discrete components or as portions of other types of assemblies (e.g., an LTCC device, a small PCB assembly, and so on). In still other embodiments, some or all of these portions of the output impedance matching and video bandwidth circuits 150, 160 may be coupled to and/or integrated within the semiconductor die that includes transistor 130.

Wherever it is connected within the device 100, video bandwidth circuit 120, 160, 161, 162 may function to improve the LFR of device 100 caused by the interaction between the input or output impedance matching circuits 110, 150 and the bias feeds (not shown) by presenting a low impedance at envelope frequencies and/or a high impedance at RF frequencies. Video bandwidth circuit 120, 160, 161, 162 essentially may be considered to be "invisible" from an RF matching standpoint, as it primarily effects the impedance at envelope frequencies (i.e., video bandwidth circuit 120, 160, 161, 162 provides terminations for the envelope frequencies of device 100).

Low-pass matching inductor 140 and low-pass matching capacitor 146 are coupled in series between the output lead 104 and ground (or another voltage reference), and this combination of impedance matching elements functions as a second (low-pass) matching stage. Accordingly, the combination of low-pass matching inductor 140 and low-pass matching capacitor 146 may be referred to herein as a low-pass matching circuit 147. According to an embodiment, low-pass matching inductor 140 may have a value in a range between about 50 pH to about 1 nH, and low-pass matching capacitor 146 may have a value in a range between about 1 pF to about 50 pF, although these components may have values outside of these ranges, as well. According to an alternate embodiment, low pass matching circuit 147 may be excluded altogether from device 100.

Various embodiments of video bandwidth circuits (e.g., video bandwidth circuits 120, 160, 161, 162) will now be discussed in detail in conjunction with FIGS. 2-6. More specifically, FIGS. 2-5 are schematic diagrams of four different example embodiments of a video bandwidth circuit that may be coupled to connection nodes of input and/or output circuits of an RF amplifier device. Each of the video bandwidth circuit embodiments depicted in FIGS. 2-5 may have one or more performance advantages over conventional video bandwidth circuits. For example, these performance benefits may include reduced baseband impedance, improved power amplifier efficiency, improved phase response, and/or better protection of the envelope resistor.

Figure 2:
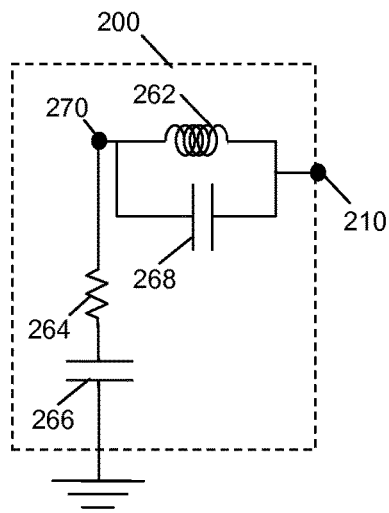
FIG. 2 is a schematic diagram of a first example embodiment of a video bandwidth circuit.

Referring first to FIG. 2, a first embodiment of a video bandwidth circuit 200 (e.g., video bandwidth circuit 120, 160, 161 or 162, FIG. 1) is coupled between a connection node 210 (e.g., connection node 118, RF cold point 148, or another connection node in the input or output impedance matching circuits) and ground (or another voltage reference). Video bandwidth circuit 200 includes an envelope inductance 262, an envelope resistor 264, and an envelope capacitor 266 coupled in series. In addition, video bandwidth circuit 200 includes a "bypass" or "parallel" capacitor 268, $C_{para}$, which is coupled in parallel with the envelope inductance 262, in an embodiment.

According to an embodiment, parallel-coupled inductance 262 and capacitor 268 form a parallel resonant circuit at frequencies in proximity to the center operational frequency of the device (e.g., device 100) within which circuit 200 is incorporated. As used herein, and according to an embodiment, the term "in proximity to the center operating frequency" means "within 20 percent of the center operating frequency." Accordingly, for example, when a device has a center operating frequency of 2.0 gigahertz (GHz), a frequency that is "in proximity to the center operating frequency" corresponds to a frequency that falls in a range from 1.8 GHz to 2.2 GHz. Although 2.0 GHz is given as an example center operating frequency, a device may have a center operating frequency that is different from 2.0 GHz, as well. In alternate embodiments, the term "in proximity to the center operating frequency" may mean "within 10 percent of the center operating frequency" or "within 5 percent of the center operating frequency."

According to an embodiment, the envelope inductance 262, $L_{env}$, may be implemented as a set of bondwires (e.g., bondwires 862, 962, FIGS. 8, 9) coupling the connection node 210 to the envelope resistor 264, $R_{env}$. In another embodiment, the envelope inductance 262 may be implemented as one or more integrated inductors, such as integrated inductors in an IPD (e.g., inductors 1062, FIG. 2), or integrated inductors in a semiconductor die that includes the transistor 130. Alternatively, the envelope inductance 262 may be implemented as a discrete component. In whichever embodiment, envelope inductance 262 may have a value in a range between about 5 pH to about 2000 pH. Desirably, envelope inductance 262 has a value less than about 500 pH (e.g., as low as 50 pH, in an embodiment, or possibly even lower). Bypass capacitor 268 may have a value in a range between about 3.0 pF to about 1300 pF. In other embodiments, the values of envelope inductance 262 and/or bypass capacitor 268 may be lower or higher than the above-given ranges.

According to an embodiment, first terminals of envelope inductance 262 and bypass capacitor 268 are coupled to node 210, and second terminals of envelope inductance 262 and bypass capacitor 268 are coupled to node 270. A first terminal of envelope resistor 264 is coupled to node 270, and a second terminal of envelope resistor 264 is coupled to a first terminal of envelope capacitor 266. A second terminal of the envelope capacitor 266 is coupled to ground (or another voltage reference). Envelope resistor 264 may have a value in a range between about 0.1 ohm to about 5.0 ohm, and envelope capacitor 266 may have a value in a range between about 5 nanofarads (nF) to about 1 microfarad (μF), although these components may have values outside of these ranges, as well. Finally, although the sequence of components between node 210 and the ground reference node is $L_{env}//C_{para}$ ("//" means "in parallel with"), $R_{env}$, and $C_{env}$, the order of components in the series circuit could be different, in other embodiments.

A good approximation of the resonant frequency, $F_R$, of the parallel resonant circuit that includes the envelope inductance 262, $L_{env}$, and bypass capacitor 268, $C_{para}$, is given by:

$$F_R = \frac{1}{2\pi\sqrt{(L_{env}C_{para})}},\quad\text{(Eqn. 1)}$$

Accordingly, for example, when the device is designed to have a center operating frequency of about 2.0 GHz, for example, envelope inductance 262 may have a value of about 63 pH, and bypass capacitor 268 may have a value of about 100 pF, although other values may be used, as well. In such an embodiment, a reasonable approximate value for the envelope resistor 238 may be about 0.5 ohm, and a reasonable approximate value for the envelope capacitor 266 may be about 2.0 nF to about 100 nF (e.g., about 30 nF or some other value). Of course, other values may be selected as well, particularly when the center operating frequency of the device is different from 2.0 GHz.

Because $L_{env}//C_{para}$ form a parallel resonant circuit at frequencies in proximity to the center operational frequency of the device, the parallel resonant circuit $L_{env}//C_{para}$ essentially appears as an open circuit to such frequencies. Accordingly, RF energy near the center operational frequency that may be present at the node 210 to which circuit 200 is coupled will be deflected by the parallel resonant circuit $L_{env}//C_{para}$. This deflection may be provided even using a relatively low inductance value for inductance 262. For these reasons, circuit 200 may significantly improve the LFR of a device (e.g., device 100) in which it is incorporated by presenting a low impedance at envelope frequencies and a high impedance at RF frequencies.

In addition, circuit 200 may increase the device efficiency, since it allows less RF current to flow through (and be dissipated by) the envelope resistor 264. This characteristic of circuit 200 also serves to better protect the envelope resistor 264 from potential compromise due to excessive current flow through the envelope resistor 264. Finally, because circuit 200 presents a high impedance to RF frequencies in proximity to the center operational frequency of a device into which it is incorporated, it is not as important for circuit 200 to be connected to an RF cold point (e.g., RF cold point 148, FIG. 1), although it may be. Instead, the benefits of circuit 200 may be achieved even when circuit 200 is coupled to a node that is not "cold" to RF frequencies. This includes other nodes in both the input and output impedance matching circuits (e.g., nodes 118, 149, 151, or other nodes in circuits 110, 150, FIG. 1). Some of the potential performance benefits of circuit 200 will be described in more detail later in conjunction with FIGS. 11 and 12.

Figure 3:
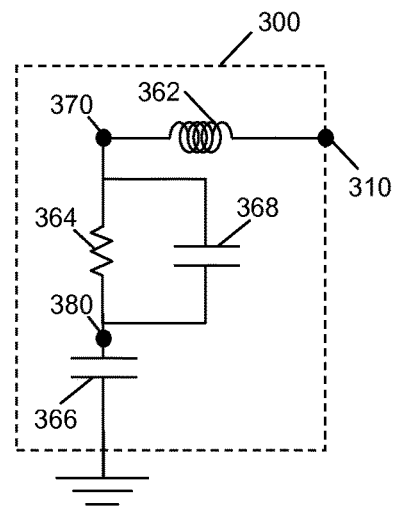
FIG. 3 is a schematic diagram of a second example embodiment of a video bandwidth circuit.

Referring now to FIG. 3, a second embodiment of a video bandwidth circuit 300 (e.g., video bandwidth circuit 120, 160, 161 or 162, FIG. 1) is coupled between a connection node 310 (e.g., connection node 118, RF cold point 148, or another connection node) and ground (or another voltage reference). Video bandwidth circuit 300 also includes an envelope inductance 362, an envelope resistor 364, and an envelope capacitor 366 coupled in series. In addition, video bandwidth circuit 300 includes a bypass capacitor 368, $C_{para}$, which is coupled in parallel with the envelope resistor 364, in an embodiment.

More specifically, a first terminal of envelope inductance 362 is coupled to node 310, and a second terminal of envelope inductance 362 is coupled to node 370. First terminals of envelope resistor 364 and bypass capacitor 368 are coupled to node 370, and second terminals of envelope resistor 364 and bypass capacitor 368 are coupled to node 380. A first terminal of envelope capacitor 366 is coupled to node 380, and a second terminal of envelope capacitor 366 is coupled to ground (or another voltage reference).

Once again, envelope inductance 362 may have a value in a range between about 5 pH to about 2000 pH, bypass capacitor 368 may have a value in a range between about 3.0 pF to about 1300 pF, envelope resistor 364 may have a value in a range between about 0.1 ohm to about 5.0 ohm, and envelope capacitor 366 may have a value in a range between about 5 nF to about 1 µF, although these components may have values outside of these ranges, as well. When incorporated into a device with a center operational frequency of 2.0 GHz, for example, envelope inductance 362 reasonably may have an inductance value of about 220 pH, bypass capacitor 368 may have a capacitance value of about 150 pF, envelope resistor 338 may have a resistance value of about 0.5 ohm, and envelope capacitor 266 may have a capacitance value of about 2.0 nF to about 100 nF (e.g., about 30 nF or some other value). Of course, other values may be selected as well. Finally, although the sequence of components between node 310 and the ground reference node is $L_{env}$, $R_{env}//C_{para}$, and $C_{env}$, the order of components in the series circuit could be different, in other embodiments.

Because capacitor 368 may function to route RF current around the envelope resistor 364, circuit 300 may result in a reduction in the RF current dissipated by the envelope resistor 364. This characteristic of circuit 300 also serves to better protect the envelope resistor 364 from potential compromise due to excessive current flow through the envelope resistor 364. Further, this configuration may result in an improved LFR for the device. Optimally, video bandwidth circuit 300 would be coupled to an RF cold point (e.g., RF cold point 148, FIG. 1), although it may be coupled to other connection nodes, as well.

Figure 4:
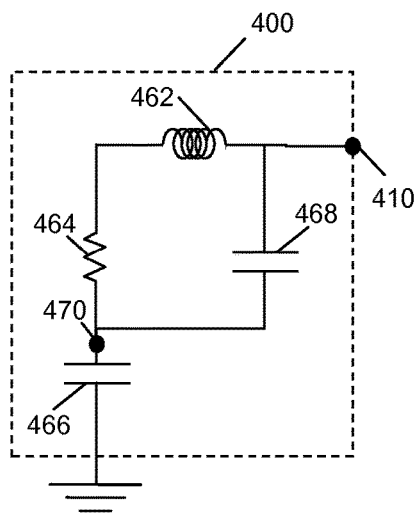
FIG. 4 is a schematic diagram of a third example embodiment of a video bandwidth circuit.

Referring now to FIG. 4, a third embodiment of a video bandwidth circuit 400 (e.g., video bandwidth circuit 120, 160, 161 or 162, FIG. 1) is coupled between a connection node 410 (e.g., connection node 118, RF cold point 148, or another connection node) and ground (or another voltage reference). Video bandwidth circuit 400 also includes an envelope inductance 462, an envelope resistor 464, and an envelope capacitor 466 coupled in series. In addition, video bandwidth circuit 400 includes a bypass capacitor 468, $C_{para}$, which is coupled in parallel with the envelope inductance 462 and envelope resistor 464, in an embodiment.

More specifically, a first terminal of envelope inductance 462 is coupled to node 410, and a second terminal of envelope inductance 462 is coupled to a first terminal of envelope resistor 464. A second terminal of envelope resistor 464 is coupled to node 470, and bypass capacitor 468 is coupled across nodes 410 and 470. A first terminal of envelope capacitor 466 is coupled to node 470, and a second terminal of envelope capacitor 466 is coupled to ground (or another voltage reference).

Once again, envelope inductance 462 may have a value in a range between about 5 pH to about 2000 pH, bypass capacitor 468 may have a value in a range between about 3.0 pF to about 1300 pF, envelope resistor 464 may have a value in a range between about 0.1 ohm to about 5.0 ohm, and envelope capacitor 466 may have a value in a range between about 5 nF to about 1 µF, although these components may have values outside of these ranges, as well. When incorporated into a device with a center operational frequency of 2.0 GHz, for example, envelope inductance 462 reasonably may have an inductance value of about 100 pH, envelope resistor 438 may have a resistance value of about 0.5 ohm, bypass capacitor 468 may have a capacitance value of about 100 pF, and envelope capacitor 266 may have a capacitance value of about 2.0 nF to about 100 nF (e.g., about 30 nF or some other value). Of course, other values may be selected as well. Finally, although the sequence of components between node 410 and the ground reference node is ($L_{env}$, $R_{env}$)//$C_{para}$, and $C_{env}$, the order of components in the series circuit could be different, in other embodiments.

Circuit 400 may have good performance using a relatively low inductance value for inductance 462. For this reason, circuit 400 may significantly improve the LFR of a device (e.g., device 100) in which it is incorporated by presenting a low impedance at envelope frequencies. Optimally, video bandwidth circuit 400 would be coupled to an RF cold point (e.g., RF cold point 148, FIG. 1), although it may be coupled to other connection nodes, as well.

Figure 5:
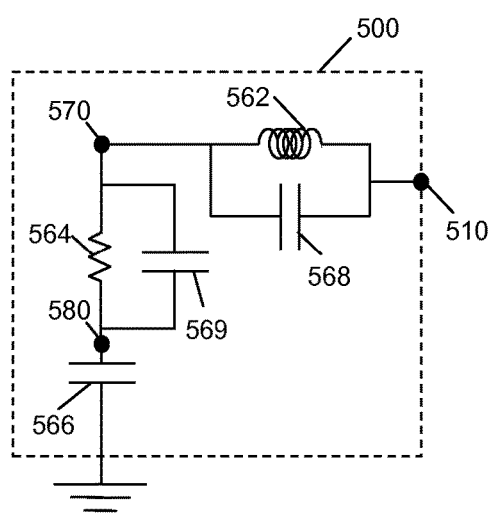
FIG. 5 is a schematic diagram of a fourth example embodiment of a video bandwidth circuit.

Referring now to FIG. 5, a fourth embodiment of a video bandwidth circuit 500 (e.g., video bandwidth circuit 120, 160, 161 or 162, FIG. 1) is coupled between a connection node 510 (e.g., connection node 118, RF cold point 148, or another connection node) and ground (or another voltage reference). Video bandwidth circuit 500 also includes an envelope inductance 562, an envelope resistor 564, and an envelope capacitor 566 coupled in series. In addition, video bandwidth circuit 500 includes a first bypass capacitor 568, $C_{para1}$, which is coupled in parallel with the envelope inductance 562, and a second bypass capacitor 569, $C_{para2}$, which is coupled in parallel with the envelope resistor 564, in an embodiment.

More specifically, first terminals of envelope inductance 562 and first bypass capacitor 568 are coupled to node 510, and second terminals of envelope inductance 562 and bypass capacitor 568 are coupled to node 570. First terminals of envelope resistor 564 and second bypass capacitor 569 coupled to node 570, and second terminals of envelope resistor 564 and second bypass capacitor 569 are coupled to node 580. A first terminal of envelope capacitor 566 is coupled to node 580, and a second terminal of the envelope capacitor 566 is coupled to ground (or another voltage reference). According to an embodiment, the circuit that includes parallel-coupled envelope inductance 562 and first bypass capacitor 568 (i.e., $L_{env}//C_{para1}$) forms a parallel resonant circuit at frequencies in proximity to the center operational frequency of the device (e.g., device 100) within which circuit 500 is incorporated.

Once again, envelope inductance 562 may have a value in a range between about 5 pH to about 2000 pH, envelope resistor 564 may have a value in a range between about 0.1 ohm to about 5.0 ohm, and envelope capacitor 566 may have a value in a range between about 5 nF to about 1 μF, although these components may have values outside of these ranges, as well. Further, first bypass capacitor 568 may have a value in a range between about 3.0 pF to about 1300 pF, and second bypass capacitor 569 may have a value in a range between about 3.0 pF to about 1300 pF. When incorporated into a device with a center operational frequency of 2.0 GHz, for example, envelope inductance 562 reasonably may have an inductance value of about 63 pH, first bypass capacitor 568 may have a capacitance value of about 100 pF, envelope resistor 538 may have a resistance value of about 0.5 ohm, second bypass capacitor 569 may have a capacitance value of about 100 pF, and envelope capacitor 566 may have a capacitance value of about 2.0 nF to about 100 nF (e.g., about 30 nF or some other value). Of course, other values may be selected as well. Finally, although the sequence of components between node 510 and the ground reference node is $L_{env}//C_{para1}$, $R_{env}//C_{para2}$, and $C_{env}$, the order of components in the series circuit could be different, in other embodiments.

Because $L_{env}//C_{para1}$ form a parallel resonant circuit at frequencies in proximity to the center operational frequency of the device, the parallel resonant circuit $L_{env}//C_{para1}$ essentially appears as an open circuit to such frequencies. Accordingly, RF energy near the center operational frequency that may be present at the node 510 to which circuit 500 is coupled will be deflected by the parallel resonant circuit $L_{env}//C_{para1}$. This deflection may be provided even using a relatively low inductance value for inductance 562. For these reasons, circuit 500 may significantly improve the LFR of a device (e.g., device 100) in which it is incorporated by presenting a low impedance at envelope frequencies and a high impedance at RF frequencies.

In addition, circuit 500 may increase the device efficiency, since it allows less RF current to flow through (and be dissipated by) the envelope resistor 564. This characteristic of circuit 500 is further enhanced by the inclusion of the second bypass capacitor 569, $C_{para2}$. Accordingly, circuit 500 may even better protect the envelope resistor 564 from potential compromise due to excessive current flow through the envelope resistor 564. Finally, because circuit 500 presents a high impedance to RF frequencies in proximity to the center operational frequency of a device into which it is incorporated, it is not as important for circuit 500 to be connected to an RF cold point (e.g., RF cold point 148, FIG. 1), although it may be. Instead, the benefits of circuit 500 may be achieved even when circuit 500 is coupled to a node that is not "cold" to RF frequencies (e.g., another node in the input or output impedance matching circuits 110, 150).

Figure 6:
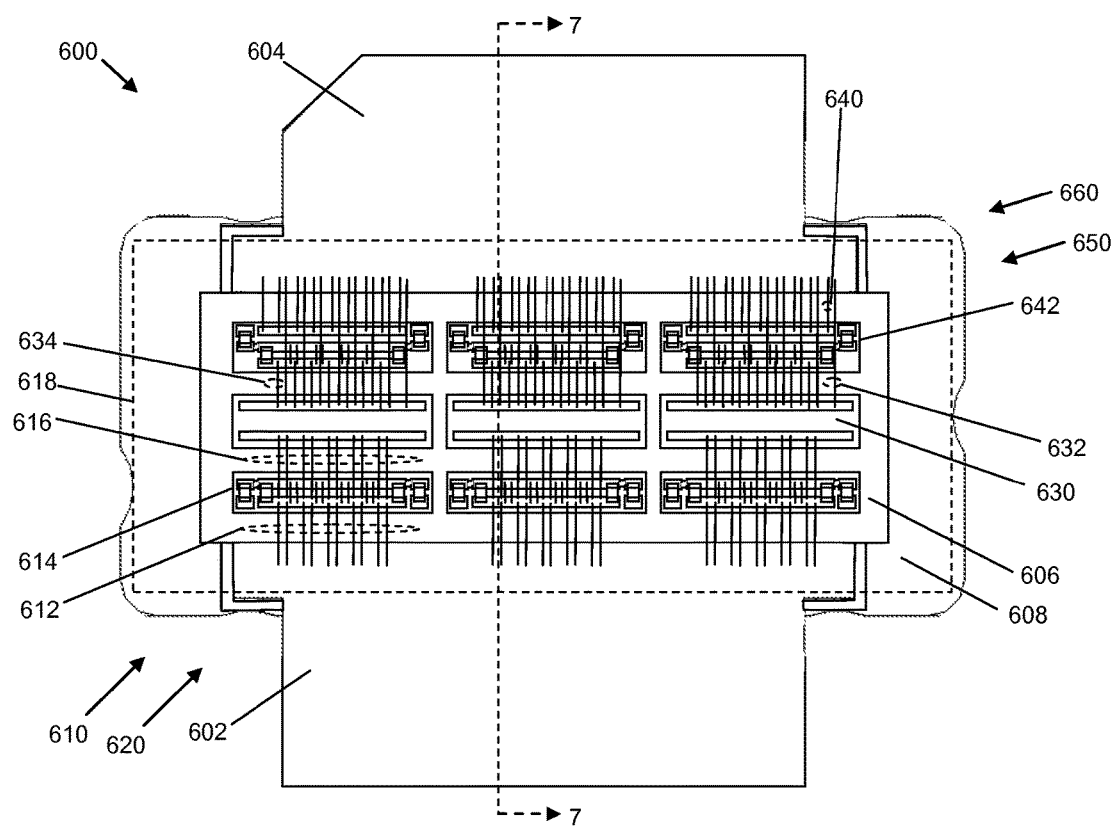
FIG. 6 is a top view of an example of a packaged RF amplifier device that embodies the circuit of FIG. 1, in accordance with an example embodiment.
Figure 7:
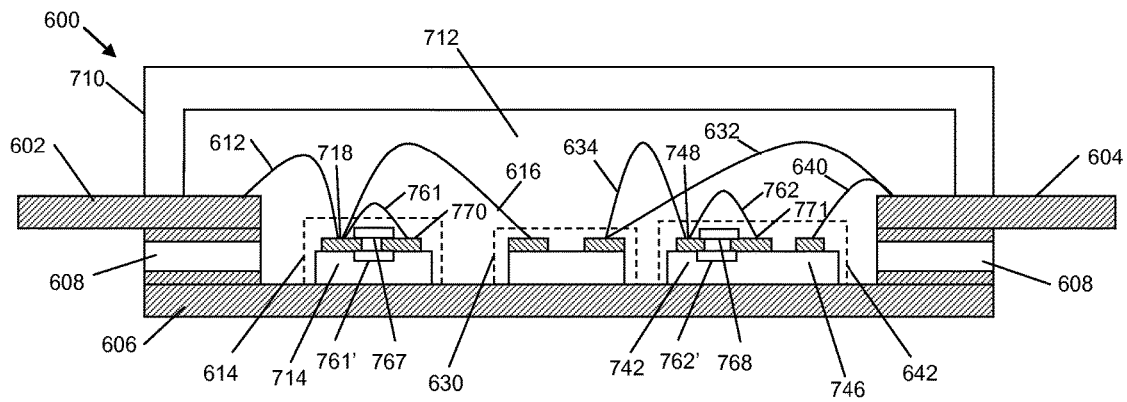
FIG. 7 is a cross-sectional, side view of the RF amplifier device of FIG. 6 along line 7-7.

FIG. 6 is a top view of an example of a packaged RF amplifier device 600 that embodies the circuit of FIG. 1, and that includes modified video bandwidth circuits 620, 660, in accordance with an example embodiment. For enhanced understanding, FIG. 6 should be viewed in conjunction with FIG. 7, which is a cross-sectional, side view of the semiconductor device 600 of FIG. 6 along line 7-7. More specifically, FIG. 7 is a cross-sectional view through input lead 602, input impedance matching circuit 610, transistor 630, output impedance matching circuit 650, and output lead 604. FIG. 7 also illustrates a cap 710, which may be implemented in air cavity package embodiments to seal the interior components of device 600 within an air cavity 712.

Device 600 includes an input lead 602 (e.g., input lead 102, FIG. 1), an output lead 604 (e.g., output lead 104, FIG. 1), a flange 606 (or "device substrate"), an isolation structure 608, one or more transistors 630 (e.g., transistor 130, FIG. 1), an input impedance matching circuit 610 (e.g., input impedance matching circuit 110, FIG. 1), an input-side video bandwidth circuit 620 (e.g., video bandwidth circuit 120, FIG. 1), an output impedance matching circuit 650 (e.g., output impedance matching circuit 150, FIG. 1), and an output-side video bandwidth circuit 660 (e.g., video bandwidth circuit 160, FIG. 1), all of which may be packaged together as parts of the device. Although only one video bandwidth circuit 620, 660 would likely be included in an embodiment of an RF power amplifier device, multiple video bandwidth circuits 620, 660 are shown in FIG. 6 to indicate that a video bandwidth circuit may be coupled to an input circuit or an output circuit, in various embodiments. In the example of FIG. 6, device 600 includes three transistors 630 that essentially function in parallel, although another semiconductor device may include one or two transistors or more than three transistors, as well. In addition, device 600 includes three input-side IPD assemblies 614 and three output-side IPD assemblies 642, which also essentially function in parallel. It is to be understood that more or fewer of IPD assemblies 614, 642 may be implemented, as well. For purposes of clarity, transistors 630 and IPD assemblies 614, 642 each may be referred to in the singular sense, below, as will analogous components in other, later-described Figures. It is to be understood that the description of a particular device component in the singular sense applies to the set of all such components. According to an embodiment, jumper wires (not illustrated) may be electrically coupled between the multiple transistors 630, input-side IPD assemblies 614, and output-side IPD assemblies 642, in order to provide low frequency paths between corresponding components.

According to an embodiment, device 600 is incorporated in an air cavity package, in which transistors 630 and various impedance matching and video bandwidth elements are located within an enclosed air cavity 712. Basically, the air cavity is bounded by flange 606, isolation structure 608, and a cap 710 overlying and in contact with the isolation structure 608 and leads 602, 604. In FIG. 6, an example perimeter of the cap 710 is indicated by dashed box 618. In other embodiments, a device may be incorporated into an overmolded package (i.e., a package in which the electrical components within the active device area are encapsulated with a non-conductive molding compound, and in which portions of the leads 602, 604, and all or portions of the isolation structure 608 also may be encompassed by the molding compound).

Flange 606 includes a rigid electrically-conductive substrate, which has a thickness that is sufficient to provide structural support for electrical components and elements of device 600. In addition, flange 606 may function as a heat sink for transistors 630 and other devices mounted on flange 606. Flange 606 has a top and bottom surface (only a central portion of the top surface is visible in FIG. 6), and a substantially-rectangular perimeter that corresponds to the perimeter of the device 600 (e.g., to the perimeter of isolation structure 608, described below).

Flange 606 is formed from a conductive material, and may be used to provide a ground reference node for the device 600. For example, various components and elements may have terminals that are electrically coupled to flange 606, and flange 606 may be electrically coupled to a system ground when the device 600 is incorporated into a larger electrical system. At least the surface of flange 606 is formed from a layer of conductive material, and possibly all of flange 606 is formed from bulk conductive material. Alternatively, flange 606 may have one or more layers of non-conductive material below its top surface. Either way, flange 606 has a conductive top surface. Flange 606 may more generally be referred to as a substrate with a conductive surface.

Isolation structure 608 is attached to the top surface of flange 606. For example, isolation structure 608 may include a layer of metallization on its bottom surface, which may be soldered to or otherwise attached to the top surface of flange 606. Isolation structure 608 is formed from a rigid, electrically insulating material (i.e., a material with a dielectric constant in a range from about 6.0 to about 10.0, although materials with higher or lower dielectric constants may be used), and has a top surface and an opposed bottom surface. The term "isolation structure," as used herein, refers to a structure that provides electrical isolation between conductive features of a device (e.g., between leads 602, 604 and flange 606). For example, isolation structure 608 may be formed from inorganic materials (e.g., ceramic such as aluminum oxide, aluminum nitride, and so on) and/or organic materials (e.g., one or more polymers or PCB materials). In an embodiment in which isolation structure 608 comprises PCB materials (e.g., the isolation structure 608 essentially includes a single or multi-layer PCB), conductive layers (e.g., copper layers) may be included on the top and bottom surfaces of the isolation structure. In a further embodiment, a conductive layer on the top surface of the isolation structure 608 may be patterned and etched to form a leadframe (including leads 602, 604) for the device 600, and a conductive layer on the bottom surface of the isolation structure 608 may be coupled to the flange 606. In other embodiments, conductive layers may be excluded from the top and/or bottom surface of the isolation structure 608. In such embodiments, leads (e.g., leads 602, 604) may be coupled to the isolation structure 608 using epoxy (or other adhesive materials), and/or the isolation structure 608 may be coupled to the flange 606 using epoxy (or other adhesive materials). In still other embodiments, the isolation structure 608 may be milled at the portion of its top surface to which a lead is attached.

Isolation structure 608 has a frame shape, in an embodiment, which includes a substantially enclosed, four-sided structure with a central opening. Isolation structure 608 may have a substantially rectangular shape, as shown in FIG. 6, or isolation structure 608 may have another shape (e.g., annular ring, oval, and so on). Isolation structure 608 may be formed as a single, integral structure, or isolation structure 608 may be formed as a combination of multiple members. In addition, isolation structure 608 may be formed from a homogenous material, or isolation structure 608 may be formed from multiple layers.

The input and output leads 602, 604 are mounted on a top surface of the isolation structure 608 on opposed sides of the central opening, and thus the input and output leads 602, 604 are elevated above the top surface of the flange 606, and are electrically isolated from the flange 606. For example, the input and output leads 602, 604 may be soldered or otherwise attached to metallization on a top surface of isolation structure 608. The metallization may be considered to be conductive pads to which the input and output leads 602, 604 are coupled. Generally, the input and output leads 602, 604 are oriented in order to allow for attachment of bondwires (e.g., bondwires 612, 632, 640) between the input and output leads 602, 604 and components and elements within the central opening of isolation structure 608.

Transistors 630 and various elements of the input and output impedance matching circuits 610, 650 and video bandwidth circuits 620, 660 are mounted on a generally central portion of the top surface of a flange 606 that is exposed through the opening in isolation structure 608. According to an embodiment, transistors 630 are positioned within the active device area of device 600, along with IPD assemblies 614, 642 that include some of the impedance matching and video bandwidth elements. For example, the transistors 630 and IPD assemblies 614, 642 may be coupled to flange 606 using conductive epoxy, solder, solder bumps, sintering, and/or eutectic bonds.

Each transistor 630 has a control terminal (e.g., a gate) and two current conducting terminals (e.g., a drain and a source). The control terminal of each transistor 630 is coupled to the input impedance matching circuit 610. In addition, one current conducting terminal (e.g., the drain) is coupled to the output impedance matching circuit 650 and to the output lead 604. The other current conducting terminal (e.g., the source) is coupled to the flange 606 (e.g., to ground), in an embodiment.

The input impedance matching circuit 610 (e.g., input impedance matching circuit 110, FIG. 1) is coupled between the input lead 602 (e.g., input lead 102, FIG. 1) and the control terminal of the transistor 630 (e.g., transistor 130, FIG. 1). In the device 600 of FIG. 6, the input impedance matching circuit 610 includes two inductive elements 612, 616 (e.g., inductive elements 112, 116, FIG. 1) and a shunt capacitor (e.g., capacitor 114, FIG. 1). As is more clearly indicated in FIG. 7, the shunt capacitor 714 of input impedance matching circuit 610 may be included in IPD assembly 614, according to an embodiment. In other embodiments, the capacitor 714 may not form a portion of an IPD assembly, but instead may be a discrete capacitor, or a capacitor that is formed in another type of assembly (e.g., an LTCC assembly). In still other alternate embodiments, the capacitor 714 may be integrated into the transistor die (e.g., a die that includes transistor 630). As part of an IPD assembly 614, capacitor 714 will be illustrated and described in more detail in conjunction with FIG. 8.

Each inductive element 612, 616 is formed from a plurality of parallel, closely-spaced sets of bondwires, in an embodiment. For example, a first inductive element 612 (e.g., inductive element 112, FIG. 1) includes a plurality of bondwires coupled between input lead 602 and a first terminal of the shunt capacitor 714 (e.g., capacitor 114, FIG. 1), and a second inductive element 616 (e.g., inductive element 116, FIG. 1) includes a plurality of bondwires coupled between the first terminal of the shunt capacitor 714 and the control terminal of transistor 630. As will be depicted in greater detail in FIG. 8, bondwires 612, 616 may be attached to a conductive landing pad at the top surface of IPD assembly 614, which in turn is electrically coupled to a top plate of the shunt capacitor 714. The second terminal of the shunt capacitor 714 is coupled to the flange 606 (e.g., to ground).

According to an embodiment, an input-side video bandwidth circuit 620 (e.g., one of circuits 200, 300, 400, 500, FIGS. 2-5, and most desirably one of circuits 200, 500) may be coupled to a connection node in the input impedance matching circuit 610. For example, the input-side video bandwidth circuit 620 may be coupled to a connection node 718 (e.g., node 118, FIG. 1), in the form of a conductive landing pad, which is positioned between the series inductors 612, 616. According to an embodiment, the connection node 718 also is electrically coupled to the top plate of the shunt capacitor 714.

According to an embodiment, the shunt capacitor 714 and the components of the video bandwidth circuit 620 may be implemented in IPD assembly 614. FIG. 7 shows, for example, an envelope inductance 761 in the form of a bondwire that is coupled between the connection node 718 and another node 770 (e.g., node 270, FIG. 2), and a bypass capacitor 767 that is also coupled across nodes 718 and 770. As indicated in FIG. 7, the bondwire implementation of envelope inductance 761 may be replaced with an integrated inductor 761', in an alternate embodiment. In other embodiments, some or all elements of the video bandwidth circuit 620 may be implemented as discrete components that do not form a portion of an IPD assembly, or some or all elements of the video bandwidth circuit 620 may be integrated into or coupled to the transistor die 630.

Figure 8:
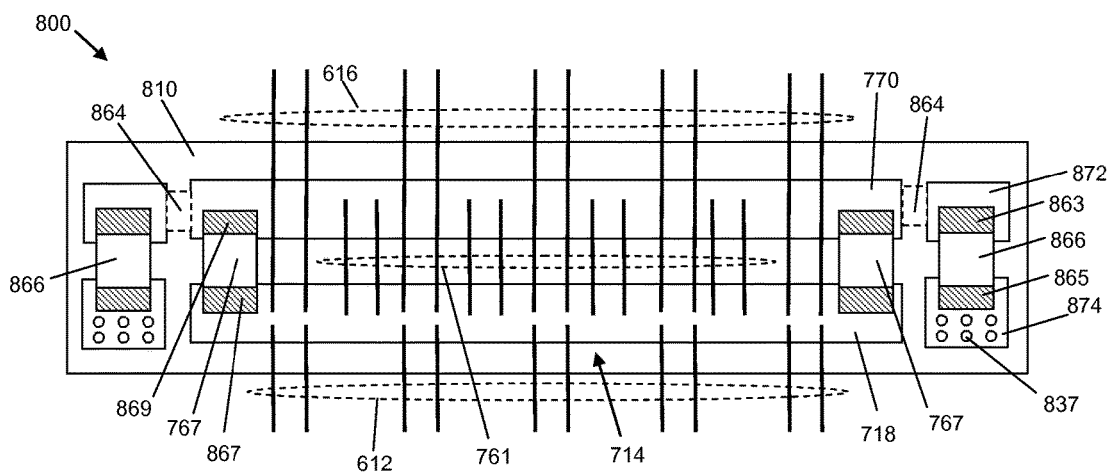
FIG. 8 is a top view of an integrated passive device (IPD) assembly that includes a portion of an input impedance matching circuit and a video bandwidth circuit, in accordance with an example embodiment.

To illustrate an embodiment of an input-side IPD assembly in more detail, FIG. 8 is provided, which is a top view of an example of an input-side IPD assembly 800 that includes components of the input impedance matching circuit 610 and the input-side video bandwidth circuit 620. According to an embodiment, IPD assembly 800 includes and is supported by an IPD substrate 810. IPD substrate 810 includes a base semiconductor substrate, which may be formed from any of a variety of semiconductor materials, including but not limited to silicon, gallium arsenide, gallium nitride, and so on. A plurality of conductive layers and insulating layers (not depicted in FIG. 8) are formed over the top surface of the base semiconductor substrate, and an additional conductive layer may be formed on the bottom surface of the semiconductor substrate. The bottom-side conductive layer may serve as a ground reference node, and may facilitate physical and electrical attachment of the IPD assembly 800 to an underlying structure (e.g., flange 606), according to an embodiment.

Portions of the top conductive layer may be exposed at the top surface of the IPD substrate 810. For example, one of these exposed portions may correspond to a connection node 718 (e.g., node 118, FIG. 1) in the form of a conductive landing pad. In addition, other exposed portions of the top conductive layer may correspond to additional conductive pads 770, 872, 874, which enable electrical connections between the various components of the input impedance matching circuit 610 and the input-side video bandwidth circuit 620, as will be described later.

According to an embodiment, a shunt capacitor 714 (e.g., shunt capacitor 114, 714, FIGS. 1, 7) is integrally formed in the IPD assembly 800. For example, shunt capacitor 714 may be implemented as metal-insulator-metal (MIM) capacitor (e.g., with parallel metal plates electrically separated by a thin dielectric (e.g., a thin nitride or oxide)). More specifically, the shunt capacitor 714 includes a top capacitor electrode formed from portion(s) of one or more of the conductive layers, a bottom capacitor electrode formed from portion(s) of one or more other ones of the conductive layers, and dielectric material between the top and bottom capacitor electrodes, which is formed from portion(s) of one or more insulating layers.

To form the input impedance matching circuit 610, a first inductance 612 (e.g., inductance 112, 612, FIGS. 1, 6), in the form of a first bondwire array, is coupled between the input lead 602 (FIGS. 6, 7) and connection node 718, and a second inductance 616 (e.g., inductance 116, 616, FIGS. 1, 6), in the form of a second bondwire array, is coupled between the connection node 718 and the control terminal of the transistor (e.g., transistor 130, 630, FIGS. 1, 6), in an embodiment. Within the IPD assembly 800, the top plate of shunt capacitor 714 is electrically coupled to the connection node 718. The bottom plate of shunt capacitor 714 may be coupled to the ground reference node (e.g., a conductive layer at the bottom surface of the IPD assembly 800) using conductive through substrate vias (TSVs) (not shown), or other conductive features.

The video bandwidth circuit included in IPD assembly 800 corresponds to the embodiment of the video bandwidth circuit 200 illustrated in FIG. 2. More specifically, the video bandwidth circuit includes an envelope inductance 761 (e.g., envelope inductance 262), envelope resistors 864 (e.g., two parallel instances of envelope resistor 264), and envelope capacitors 866 (e.g., two parallel instances of envelope capacitor 266) coupled in series between connection node 718 (e.g., connection node 210) and the ground reference node. In addition, the video bandwidth circuit includes bypass capacitors 767 (e.g., two parallel instances of bypass capacitor 268) coupled across the envelope inductance 761. According to an embodiment, electrical connection between the video bandwidth components and the ground reference node may be accomplished using TSVs 837.

In the embodiment illustrated in FIG. 8, portions of two video bandwidth circuits are positioned at and electrically connected to opposite ends of conductive landing pad 770, and the two circuits are coupled in parallel between conductive landing pad 770 and the ground reference node. With the placement of multiple, parallel-coupled video bandwidth circuits on each side of conductive pad 770, the overall video bandwidth circuit may be more uniformly fed, and the values of the individual components comprising each parallel-coupled video bandwidth circuit may be reduced (due to the parallel-coupling) when compared with conventional devices. In other embodiments, the video bandwidth circuit may include only one series-coupled circuit (e.g., only one envelope resistor 864, one envelope capacitor 866, and one bypass capacitor 767) or more than two series-coupled circuits (e.g., more than two envelope resistors 864, envelope capacitors 866, and bypass capacitors 767).

In the embodiment of FIG. 8, the envelope inductance 761 is implemented as a plurality of bondwires that are electrically connected between connection node 718 (e.g., corresponding to node 210, FIG. 2) and conductive landing pad 770 (e.g., corresponding to node 270, FIG. 2). In an alternate embodiment, the envelope inductance may be implemented in the form of one or more integrated inductors (e.g., integrated inductors 761', FIG. 7, having a form similar to integrated inductors 762', FIG. 10).

The bypass capacitors 767 are coupled in parallel with the envelope inductance 761. Each of the bypass capacitors 767 may be, for example, a discrete capacitor that is connected (e.g., using solder, a conductive epoxy, or other means) to a top surface of IPD substrate 810. More specifically, a first terminal 867 of each bypass capacitor 767 may be connected to the connection node 718, and a second terminal 869 of each bypass capacitor 767 may be connected to conductive landing pad 770, in an embodiment.

For example, each bypass capacitor 767 may be a multiple-layer capacitor (e.g., a multiple-layer ceramic capacitor) with parallel, interleaved electrodes and wrap-around end terminations 867, 869. Alternatively, each bypass capacitor 767 may form a portion of a separate IPD (e.g., a MIM capacitor formed on a semiconductor substrate), or may be an integrated capacitor (e.g., a trench or other type of capacitor) formed within IPD substrate 810. Alternatively, each bypass capacitor 767 may be implemented as some other type of capacitor capable of providing the desired capacitance and voltage for the video bandwidth circuit.

Each envelope resistor 864 is coupled between conductive landing pad 770 (e.g., node 270, FIG. 2) and a first terminal of an envelope capacitor 866 (e.g., at conductive pad 872). The envelope resistors 864 may be integrated as part of IPD substrate 810. For example, each envelope resistor 864 may be a polysilicon resistor formed from a layer of polysilicon overlying semiconductor substrate 810, and electrically coupled between conductive pads 770 and 872 (e.g., using conductive vias and possibly other conductive layers, not shown). In other alternate embodiments, the envelope resistors 864 may be formed from tungsten silicide or another material, may be thick or thin film resistors, or may be discrete components coupled to a top surface of IPD substrate 810.

Each envelope capacitor 866 is coupled between conductive pad 872 and a ground reference node (e.g., through conductive pad 874). Each of the envelope capacitors 866 may be, for example, a discrete capacitor that is connected (e.g., using solder, a conductive epoxy, or other means) to a top surface of IPD substrate 810. More specifically, a first terminal 863 of each capacitor 866 may be connected to a first contact pad 872, and a second terminal 865 of each capacitor 866 may be connected to a second contact pad 874. As indicated previously, the second contact pad 874 may be electrically coupled to the ground reference node (e.g., a conductive layer on the bottom surface of the IPD assembly 800) using TSVs 837.

For example, each envelope capacitor 866 may be a multiple-layer capacitor with parallel, interleaved electrodes and wrap-around end terminations 863, 865. Alternatively, each envelope capacitor 866 may form a portion of a separate IPD, or may be an integrated capacitor formed within IPD substrate 810. Alternatively, each envelope capacitor 866 may be implemented as some other type of capacitor capable of providing the desired capacitance and voltage for the video bandwidth circuit.

Referring again to FIGS. 6 and 7, the output impedance matching circuit 650 (e.g., output impedance matching circuit 150, FIG. 1) is coupled between a first current conducting terminal (e.g., drain) of transistor 630 (e.g., transistor 130, FIG. 1) and the output lead 604 (e.g., output lead 104, FIG. 1). In the device 600 of FIG. 6, the output impedance matching circuit 650 includes three inductive elements 632, 634, 640 (e.g., inductors 132, 134, 140, FIG. 1) and two capacitors 342, 346 (e.g., capacitors 142, 146, FIG. 1). As is more clearly indicated in FIG. 7, the capacitors 742, 746 of output impedance matching circuit 650 may be included in IPD assembly 642, according to an embodiment. In other embodiments, the capacitors 742 and/or 746 may not form a portion of an IPD assembly, but instead may be discrete capacitors that are distinct from each other, or capacitors that are formed in another type of assembly (e.g., an LTCC assembly). In still other alternate embodiments, either or both of the capacitors 742, 746 may be integrated into the transistor die (e.g., a die that includes transistor 630). As part of an IPD assembly 642, capacitors 742, 746 will be illustrated and described in more detail in conjunction with FIGS. 9 and 10. In an embodiment in which low-pass matching circuit 147 is excluded, IPD assembly 642 may exclude capacitor 746 (e.g., capacitor 146, FIG. 1).

Inductive elements 632, 634, 640 each may be formed from a plurality of parallel, closely-spaced sets of bondwires, in an embodiment. For example, a series inductive element 632 (e.g., series inductor 132, FIG. 1) includes a plurality of bondwires coupled between the first current conducting terminal (e.g., the drain) of transistor 630 and the output lead 604. A shunt inductive element 634 (e.g., shunt inductor 134, FIG. 1) may include a plurality of bondwires coupled between the first current conducting terminal of transistor 630 and the RF cold point node 748 (e.g., RF cold point 148, FIG. 1), which may be implemented as a conductive landing pad at the top surface of IPD assembly 642, in an embodiment. In alternate embodiments, the shunt inductive element 634 may be coupled to and/or integrated into the transistor die (e.g., a die that includes transistor 630). For example, the shunt inductive element 634 could be implemented as a plurality of bondwires coupled between two conductive landing pads at the top surface of the transistor die, in an embodiment, or as an integrated inductive element (e.g., a transmission line or an integrated spiral inductor) in the transistor die, in another embodiment.

A low-pass matching inductive element 640 (e.g., low-pass matching inductor 140, FIG. 1) includes a plurality of bondwires coupled between the output lead 604 and another conductive landing pad at the top surface of IPD assembly 642, which in turn is electrically connected to a first terminal of low-pass matching capacitor 746 (e.g., low-pass matching capacitor 146, FIG. 1). Second terminals of capacitors 742, 746 are electrically connected to the flange 606 (e.g., to ground).

According to an embodiment, an output-side video bandwidth circuit 660 (e.g., one of circuits 200, 300, 400, 500, FIGS. 2-5) may be coupled to a connection node in the output impedance matching circuit 650. For example, the output-side video bandwidth circuit 660 may be coupled to a connection node 748 (e.g., RF cold point 148, FIG. 1), in the form of a conductive landing pad, which also is electrically coupled to the top plate of the shunt capacitor 742. In other embodiments, the output-side video bandwidth circuit 660 may be coupled to another node in the output impedance matching circuit 650 (e.g., to one of e.g., nodes 149, 151, FIG. 1, or to another node).

According to an embodiment, the shunt and low-pass matching capacitors 742, 746 and the components of the video bandwidth circuit 660 may be implemented in IPD assembly 642. FIG. 7 shows, for example, an envelope inductance 762 in the form of a bondwire that is coupled between the connection node 748 and another node 771 (e.g., node 270, FIG. 2), and a bypass capacitor 768 that is also coupled across nodes 748 and 771. As indicated in FIG. 7, the bondwire implementation of envelope inductance 762 may be replaced with an integrated inductor 762', in an alternate embodiment. In other embodiments, some or all elements of the video bandwidth circuit 660 may be implemented as discrete components that do not form a portion of an IPD assembly, or some or all elements of the video bandwidth circuit 660 may be integrated into or coupled to the transistor die 630.

Figure 9:
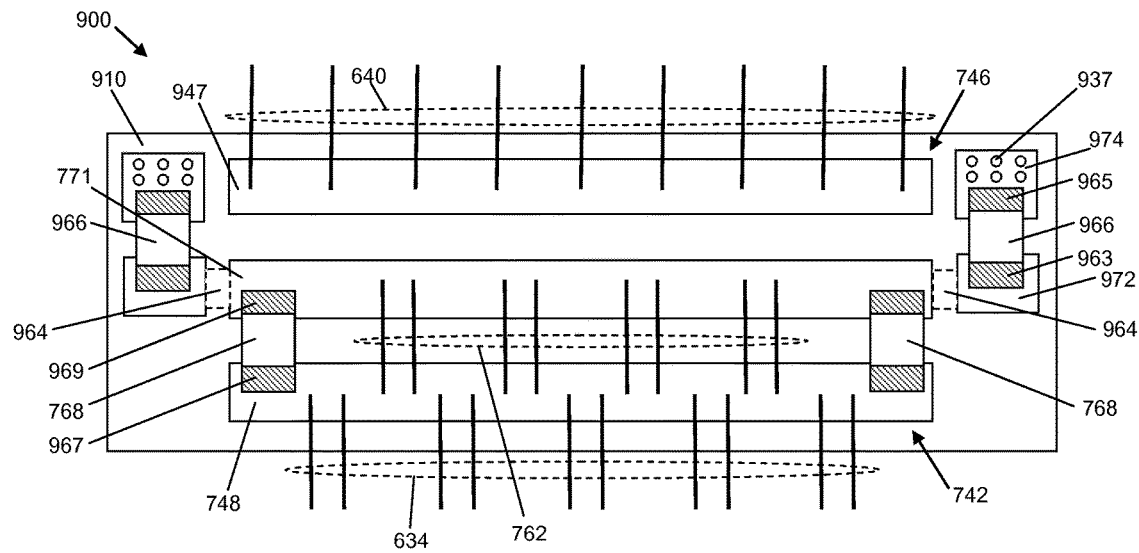
FIG. 9 is a top view of an IPD assembly that includes a portion of an output impedance matching circuit and a video bandwidth circuit, in accordance with an example embodiment.

To illustrate a first embodiment of an output-side IPD assembly in more detail, FIG. 9 is provided, which is a top view of an example of an output-side IPD assembly 900 that includes components of the output impedance matching circuit 650 and the output-side video bandwidth circuit 660. According to an embodiment, IPD assembly 900 includes and is supported by an IPD substrate 910. As with the previously-described embodiment of an IPD substrate 810, IPD substrate 910 may include a base semiconductor substrate, a plurality of conductive layers and insulating layers formed over the top surface of the base semiconductor substrate, and an additional conductive layer formed on the bottom surface of the semiconductor substrate. The bottom-side conductive layer may serve as a ground reference node, and may facilitate physical and electrical attachment of the IPD assembly 900 to an underlying structure (e.g., flange 606), according to an embodiment.

Portions of the top conductive layer may be exposed at the top surface of the IPD substrate 910. For example, one of these exposed portions may correspond to a connection node 748 (e.g., node 148, FIG. 1) in the form of a conductive landing pad. In addition, other exposed portions of the top conductive layer may correspond to additional conductive pads 771, 947, 972, 974, which enable electrical connections between the various components of the input impedance matching circuit 650 and the output-side video bandwidth circuit 660, as will be described later.

According to an embodiment, a shunt capacitor 742 (e.g., shunt capacitor 142, 742, FIGS. 1, 7) and a low-pass matching capacitor 746 (e.g., low-pass matching capacitor 146, 746, FIGS. 1, 7) are integrally formed in the IPD assembly 900. For example, shunt capacitor 742 and low-pass matching capacitor 746 each may be implemented as a MIM capacitor. More specifically, the shunt capacitor 742 includes a top capacitor electrode formed from portion(s) of one or more of the conductive layers, a bottom capacitor electrode formed from portion(s) of one or more other ones of the conductive layers, and dielectric material between the top and bottom capacitor electrodes, which is formed from portion(s) of one or more insulating layers.

To form the output impedance matching circuit 650, a first inductance 632 (e.g., inductance 132, 632, FIGS. 1, 6), in the form of a first bondwire array, is coupled between the first current conducting terminal of the transistor (e.g., transistor 130, 630, FIGS. 1, 6) and the output lead (e.g., output lead 604, FIG. 6). In addition, a second inductance 634 (e.g., inductance 134, 634, FIGS. 1, 6), in the form of a second bondwire array, is coupled between the first current conducting terminal of the transistor and connection node 748 on the IPD assembly 900. Within the IPD assembly 900, the top plate of shunt capacitor 742 is electrically coupled to the connection node 748. The bottom plate of shunt capacitor 742 may be coupled to the ground reference node (e.g., a conductive layer at the bottom surface of the IPD assembly 900) using conductive TSVs (not shown), or other conductive features. Finally, a third inductance 640 (e.g., inductance 140, 640, FIGS. 1, 6), in the form of a third bondwire array, is coupled between the output lead (e.g., output lead 604, FIG. 6) and another conductive landing pad 947 on the IPD assembly 900. Within the IPD assembly 900, the top plate of low-pass matching capacitor 746 is electrically coupled to the landing pad 947. The bottom plate of low-pass matching capacitor 746 may be coupled to the ground reference node using conductive TSVs (not shown), or other conductive features.

The video bandwidth circuit included in IPD assembly 900 corresponds to the embodiment of the video bandwidth circuit 200 illustrated in FIG. 2. More specifically, the video bandwidth circuit includes an envelope inductance 762 (e.g., envelope inductance 262), envelope resistors 964 (e.g., two parallel instances of envelope resistor 264), and envelope capacitors 966 (e.g., two parallel instances of envelope capacitor 266) coupled in series between connection node 748 (e.g., connection node 210) and the ground reference node. In addition, the video bandwidth circuit includes bypass capacitors 768 (e.g., two parallel instances of bypass capacitor 268) coupled across the envelope inductance 762. According to an embodiment, electrical connection between the video bandwidth components and the ground reference node may be accomplished using TSVs 937.

Once again, in the embodiment illustrated in FIG. 9, portions of two video bandwidth circuits are positioned at and electrically connected to opposite ends of conductive landing pad 771, and the two circuits are coupled in parallel between conductive landing pad 771 and the ground reference node. In other embodiments, the video bandwidth circuit may include only one series-coupled circuit (e.g., only one envelope resistor 964, one envelope capacitor 966, and one bypass capacitor 768) or more than two series-coupled circuits (e.g., more than two envelope resistors 964, envelope capacitors 966, and bypass capacitors 768).

In the embodiment of FIG. 9, the envelope inductance 762 is implemented as a plurality of bondwires that are electrically connected between connection node 748 (e.g., corresponding to node 210, FIG. 2) and conductive landing pad 771 (e.g., corresponding to node 270, FIG. 2). In an alternate embodiment, as shown in FIG. 10, the envelope inductance may be implemented in the form of one or more integrated inductors 762'. Other than the replacement of a bondwire array implementation of the envelope inductance 762 with an integrated inductor implementation of the envelope inductance 762', the features of IPD assembly 1000 may be substantially similar to the features of IPD assembly 900.

Figure 10:
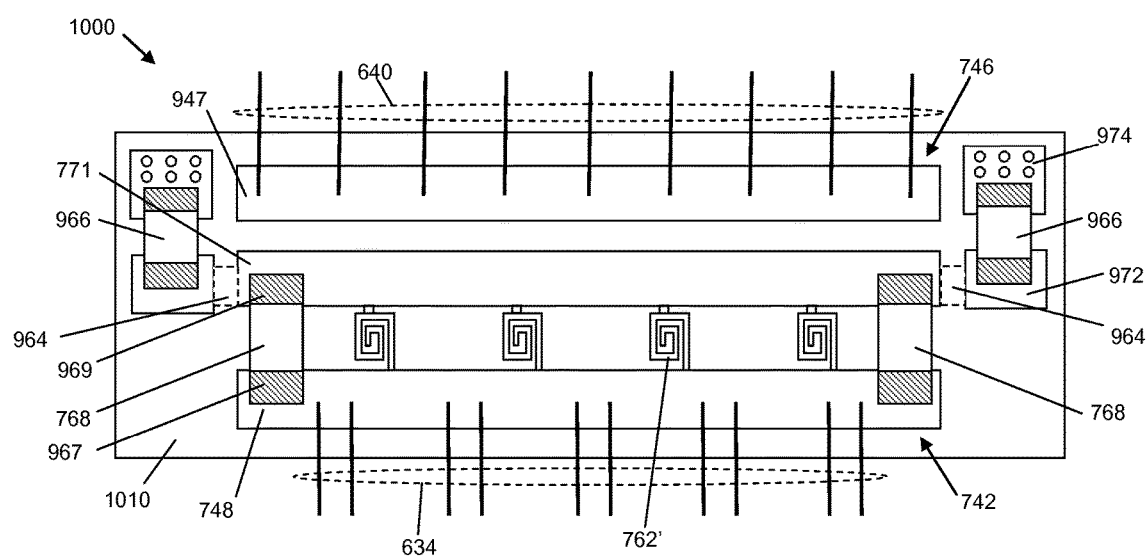
FIG. 10 is a top view of an IPD assembly that includes a portion of an output impedance matching circuit and a video bandwidth circuit, in accordance with another example embodiment.

The bypass capacitors 768 are coupled in parallel with the envelope inductance 762 (or 762', FIG. 10). According to an embodiment, the bypass capacitors 768 may be configured to have a relatively high voltage rating (e.g., between about 80 and about 150 volts, although the voltage rating may be higher or lower, in other embodiments). Each of the bypass capacitors 768 may be, for example, a discrete capacitor that is connected (e.g., using solder, a conductive epoxy, or other means) to a top surface of IPD substrate 910 (or 1010, FIG. 10). More specifically, a first terminal 967 of each bypass capacitor 768 may be connected to the connection node 748, and a second terminal 969 of each bypass capacitor 768 may be connected to conductive landing pad 771, in an embodiment.

For example, each bypass capacitor 768 may be a multiple-layer capacitor (e.g., a multiple-layer ceramic capacitor) with parallel, interleaved electrodes and wrap-around end terminations 967, 969. Alternatively, each bypass capacitor 768 may form a portion of a separate IPD, or may be an integrated capacitor formed within IPD substrate 910 (or 1010, FIG. 10). Alternatively, each bypass capacitor 768 may be implemented as some other type of capacitor capable of providing the desired capacitance and voltage for the video bandwidth circuit.

Each envelope resistor 964 is coupled between conductive landing pad 771 (e.g., node 270, FIG. 2) and a first terminal of an envelope capacitor 966 (e.g., at conductive pad 972). The envelope resistors 964 may be integrated as part of IPD substrate 910 (or 1010, FIG. 10). For example, each envelope resistor 964 may be a polysilicon resistor formed from a layer of polysilicon, and electrically coupled between conductive pads 771 and 972. In other alternate embodiments, the envelope resistors 964 may be formed from tungsten silicide or another material, may be thick or thin film resistors, or may be discrete components coupled to a top surface of IPD substrate 910 (or 1010, FIG. 10).

Each envelope capacitor 966 is coupled between conductive pad 972 and a ground reference node (e.g., through conductive pad 974). The envelope capacitors 966 may be configured to have a relatively high voltage rating (e.g., between about 80 and about 150 volts, although the voltage rating may be higher or lower, in other embodiments). Each of the envelope capacitors 966 may be, for example, a discrete capacitor that is connected (e.g., using solder, a conductive epoxy, or other means) to a top surface of IPD substrate 910 (or 1010, FIG. 10). More specifically, a first terminal 963 of each capacitor 966 may be connected to a first contact pad 972, and a second terminal 965 of each capacitor 966 may be connected to a second contact pad 974. As indicated previously, the second contact pad 974 may be electrically coupled to the ground reference node (e.g., a conductive layer on the bottom surface of the IPD assembly 900) using TSVs 937.

For example, each envelope capacitor 966 may be a multiple-layer capacitor with parallel, interleaved electrodes and wrap-around end terminations 963, 965. Alternatively, each envelope capacitor 966 may form a portion of a separate IPD, or may be an integrated capacitor formed within IPD substrate 910. Alternatively, each envelope capacitor 966 may be implemented as some other type of capacitor capable of providing the desired capacitance and voltage for the video bandwidth circuit.

Referring again to FIG. 6, the illustrated embodiment corresponds to a two-lead device (e.g., a device having one input lead 602 and one output lead 604, FIG. 6). Such a device may be incorporated into a larger electrical system by physically coupling the device to a PCB, electrically connecting the input lead to a signal source, and electrically connecting the output lead to a load. The PCB may further include one or more bias feeds (e.g., each with a length of lambda/4 or some other length) with proximal ends located close to the PCB connection(s) to the output lead and/or input lead. A blocking capacitor at the distal end of each bias lead may provide a short at a given RF frequency, which when transformed through the bias lead, appears as an open circuit.

Other embodiments include devices with multiple input leads and/or multiple output leads (e.g., one input/output lead for each transistor). Still other embodiments include devices with bias leads formed as integral portions of the device, and additional conductive features that coupled the bias leads with the impedance matching network(s). Further, although the illustrated embodiments depict a single amplification stage (i.e., a single power transistor 630) along each amplification path, other device embodiments may include multi-stage amplifiers (e.g., transistor die with both pre-amplifier and high-power amplifier transistors coupled in cascade). Further still, some of the various components of the input and output impedance matching circuits and the video bandwidth circuits may be integrated into (or coupled to) the transistor die, in other embodiments.

Figure 11:
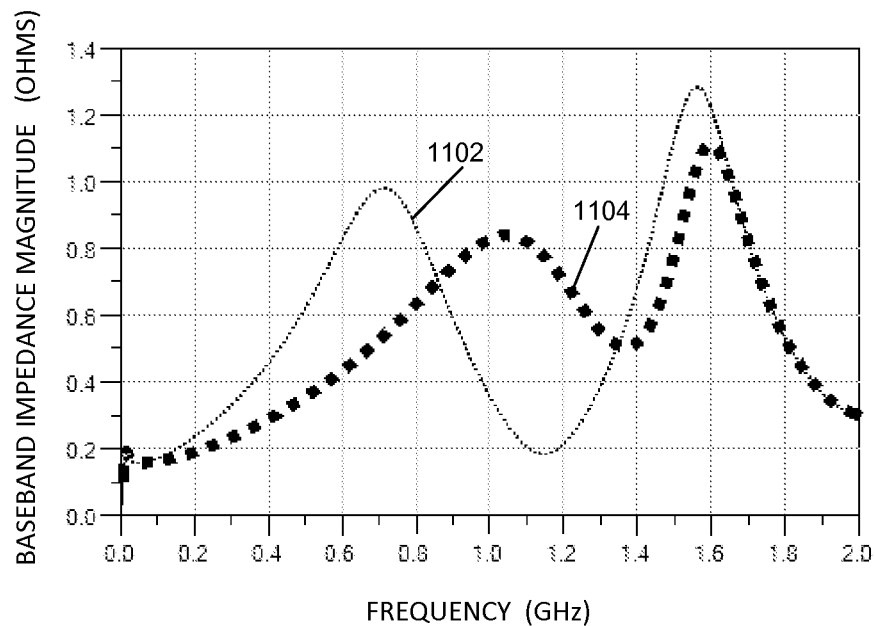
FIG. 11 is a chart comparing the magnitude of baseband impedance versus frequency for a conventional RF amplifier and an embodiment of an RF amplifier with a modified video bandwidth circuit.

As mentioned previously, various embodiments of video bandwidth circuits may present a low impedance at envelope frequencies and/or a high impedance at RF frequencies, which may significantly improve device performance. To illustrate the potential improvement in baseband impedance, FIG. 11 is a chart comparing the magnitude of baseband impedance (from the transistor drain looking toward the load) versus frequency for a conventional RF amplifier and an embodiment of an RF amplifier with a modified video bandwidth circuit. In FIG. 11, the x-axis represents frequency (in GHz), and the y-axis represents the magnitude of baseband impedance, $Z_{bb}$ or $Z_{env}$ (in ohms). Trace 1102 represents the magnitude of input impedance over frequency for an RF device with a conventional video bandwidth circuit (e.g., a simple RLC series circuit). As trace 1102 indicates, a significant resonance may occur below the desired LFR of the device. In this case, the resonance occurs at about 700 megahertz (MHz), where the baseband impedance bumps up to about 1.0 ohm.

Conversely, trace 1104 represents the magnitude of baseband impedance over frequency for an embodiment of an RF device with a modified video bandwidth circuit in which an envelope impedance and a bypass capacitor form a parallel resonant circuit in proximity to the center operating frequency of the device (e.g., video bandwidth circuit 200, FIG. 2). In such a configuration, the value of the envelope inductor (e.g., $L_{env}$ 262) may be relatively low. With the ability to have a relatively low value for the envelope inductor, trace 1104 shows that the baseband impedance is significantly dampened (e.g., below 0.85 ohms), and the resonance occurs at a higher frequency (e.g., at about 1045 MHz). Further, with less RF current dissipation in the envelope resistor, the drain efficiency may be improved, as well.

Figure 12:
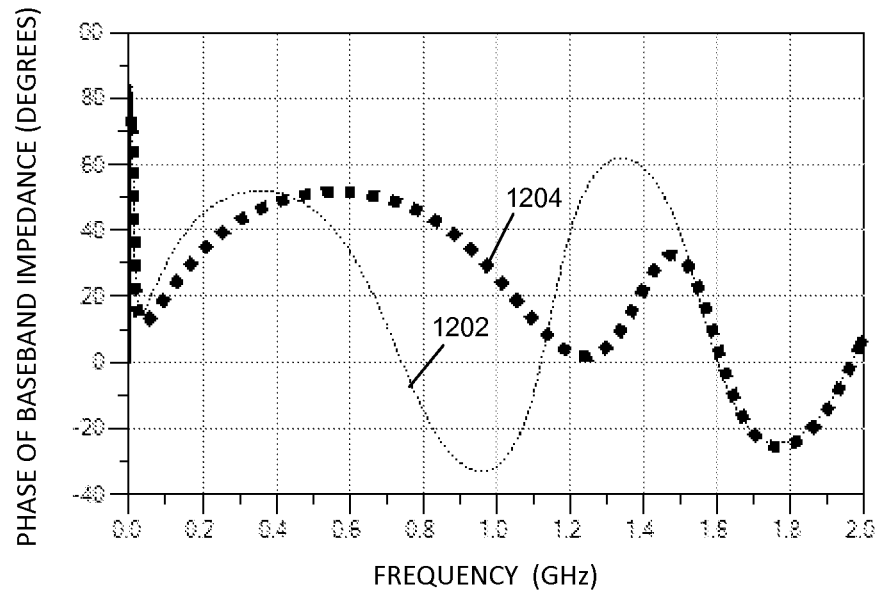
FIG. 12 is a chart comparing the phase change of baseband impedance versus frequency for a conventional RF amplifier and an embodiment of an RF amplifier with a modified video bandwidth circuit.

FIG. 12 is a chart comparing the phase change of baseband impedance versus frequency for a conventional RF amplifier and an embodiment of an RF amplifier with a modified video bandwidth circuit. In FIG. 12, the x-axis represents frequency (in GHz), and the y-axis represents phase of baseband impedance (in degrees). Trace 1202 represents phase change over frequency for an RF device with a conventional video bandwidth circuit (e.g., a simple RLC series circuit).

Conversely, trace 1204 represents phase change over frequency for an embodiment of an RF device that includes a modified video bandwidth circuit in which an envelope impedance and a bypass capacitor form a parallel resonant circuit in proximity to the center operating frequency of the device (e.g., video bandwidth circuit 200, FIG. 2). In such a configuration, the phase change is significantly flatter up to the LFR of the device. In other words, trace 1204 indicates that the variation of the baseband impedance phase may be smaller, when compared with the variation for a conventional device (trace 1202), from DC to 1.5 GHz. This also may manifest itself in improved device performance.

Figure 13:
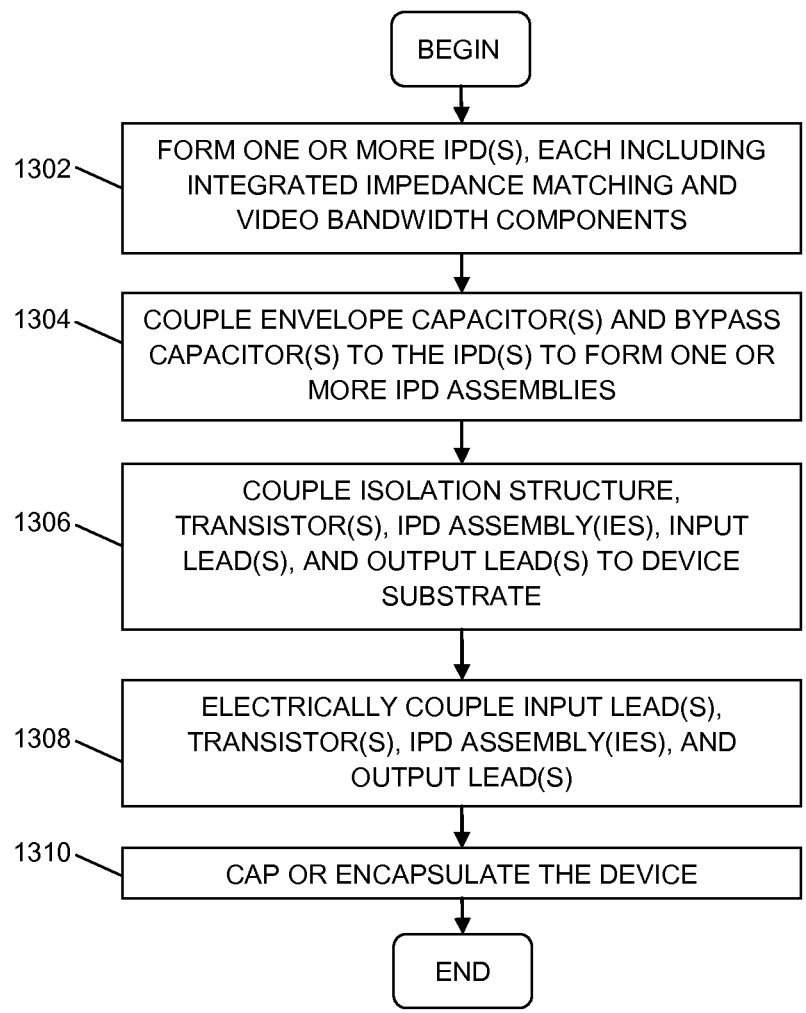
FIG. 13 is a flowchart of a method of manufacturing a packaged RF device, in accordance with an example embodiment.

FIG. 13 is a flowchart of a method of manufacturing a packaged RF device (e.g., device 600, FIG. 6) with a modified video bandwidth circuit, in accordance with an example embodiment. The method may begin, in blocks 1302-1304, by forming one or more IPD assemblies. For example, in block 1302, one or more IPDs (e.g., IPD 614, 642, 800, 900, 1000, FIGS. 6-10) may be formed, each of which includes one or more envelope inductive elements (e.g., inductive elements 761, 762, 862, 962, FIGS. 7-10), one or more integrated shunt capacitors (e.g., input capacitor 714, shunt capacitor 742, and low-pass matching capacitor 746, FIGS. 7-10), and one or more envelope resistors (e.g., resistors 864, 964, FIGS. 8-10). In alternate embodiments, each IPD may exclude the low-pass matching capacitor. In addition to forming the passive components of each IPD, forming each IPD also includes forming various conductive features (e.g., conductive layers and vias), which facilitate electrical connection between the various components of each IPD assembly.

Forming the IPD assemblies also may include forming an accessible connection node (e.g., connection node 718, 748, FIGS. 7-10) at a surface of each IPD substrate. As discussed previously, the connection node may be a conductive landing pad, which may accept attachment of an inductive element (e.g., bondwires 612, 616, 634, 761, 762, FIGS. 6-10). Each IPD substrate also may include additional conductive pads (e.g., 770, 771, 872, 874, 972, 974, FIGS. 8-10) for accepting attachment of other inductive elements (e.g., bondwires 640, 761, 762, FIGS. 6-10) or discrete components (e.g., capacitors 767, 768, 866, 966), as well.

In block 1304, one or more discrete envelope capacitors (e.g., capacitors 866, 966, FIGS. 8-10) are coupled to each IPD substrate in series with the envelope resistor(s), and one or more discrete bypass capacitors (e.g., capacitors 767, 768, FIGS. 6-10) are coupled to each IPD substrate in parallel with one or more components of the video bandwidth circuit (e.g., in parallel with either or both of the envelope inductor or envelope resistor). In alternate embodiments, the envelope and/or bypass capacitors may be implemented as integrated capacitors (e.g., particularly when the IPD substrate is formed using LTCC technology). As described previously, this results in the formation of one or more IPD assemblies, each of which includes a connection node (e.g., node 718 or 748) and one or more video bandwidth circuits, each with one or more parallel-coupled bypass capacitors.

In block 1306, for an air cavity embodiment, an isolation structure (e.g., isolation structure 608, FIG. 6) is coupled to a device substrate (e.g., flange 606). In addition, one or more active devices (e.g., transistors 630) and IPD assemblies (e.g., IPD assemblies 614, 642, 800, 900, 1000) are coupled to a portion of the top surface of the substrate that is exposed through an opening in the isolation structure. Leads (e.g., input and output leads 602, 604, and bias leads, if included) are coupled to the top surface of the isolation structure. For overmolded (e.g., encapsulated) device embodiments, the isolation structure may be excluded, and the substrate and leads may form portions of a leadframe.

In block 1308, the input lead(s), transistor(s), IPD assembly(ies), and output lead(s) are electrically coupled together. For example, the electrical connections may be made using bondwires between the various device components and elements, as discussed previously. Finally, in block 1310, the device is capped (e.g., with cap 710) or encapsulated (e.g., with mold compound, not illustrated). The device may then be incorporated into a larger electrical system.

An embodiment of an RF amplifier includes a transistor, an impedance matching circuit, and a video bandwidth circuit. The impedance matching circuit is coupled between the transistor and an RF I/O. The video bandwidth circuit is coupled between a connection node of the impedance matching circuit and a ground reference node. The video bandwidth circuit includes a plurality of components, which includes an envelope inductor and an envelope capacitor coupled in series between the connection node and the ground reference node. The video bandwidth circuit further includes a first bypass capacitor coupled in parallel across one or more of the plurality of components of the video bandwidth circuit.

An embodiment of a packaged RF amplifier device includes a device substrate, a plurality of RF I/O leads coupled to the device substrate, a transistor coupled to the device substrate, an impedance matching circuit electrically coupled between the transistor and one of the RF I/O leads, and a video bandwidth circuit electrically coupled between a connection node of the impedance matching circuit and a ground reference node. The video bandwidth circuit includes a plurality of components, which includes an envelope inductor and an envelope capacitor coupled in series between the connection node and the ground reference node. The video bandwidth circuit further includes a first bypass capacitor coupled in parallel across one or more of the plurality of components of the video bandwidth circuit.

An embodiment of a method of manufacturing an RF amplifier device includes coupling, to a device substrate, a transistor and a plurality of RF I/O leads. The method further includes electrically coupling an impedance matching circuit between the transistor and one of the RF I/O leads, and electrically coupling a video bandwidth circuit between a connection node of the impedance matching circuit and a ground reference node. The video bandwidth circuit includes a plurality of components, which includes an envelope inductor and an envelope capacitor coupled in series between the connection node and the ground reference node. The video bandwidth circuit further includes a bypass capacitor coupled in parallel across one or more of the plurality of components of the video bandwidth circuit.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) amplifier comprising:
   a transistor, wherein the transistor has a control terminal and first and second current carrying terminals;
   an output impedance matching circuit coupled to the first current carrying terminal, wherein the output impedance matching circuit includes a shunt circuit coupled between the first current carrying terminal and the ground reference node, wherein the shunt circuit includes a shunt inductance and a shunt capacitor coupled in series, and wherein an RF cold point node is present between the shunt inductance and the shunt capacitor; and
   a video bandwidth circuit coupled between the RF cold point node and a ground reference node, wherein the video bandwidth circuit includes an envelope inductor, an envelope resistor, and an envelope capacitor coupled in series between the RF cold point node and the ground reference node, and wherein the video bandwidth circuit further includes a first bypass capacitor with a first capacitor terminal coupled to a first terminal of the envelope inductor, and a second capacitor terminal coupled to a second terminal of the envelope inductor.

2. The RF amplifier of claim 1, wherein the envelope inductor and the first bypass capacitor form a parallel resonant circuit in proximity to a center operating frequency of the amplifier.

3. A radio frequency (RF) amplifier comprising:
   a transistor;
   an impedance matching circuit coupled between the transistor and an RF input/output (I/O); and
   a video bandwidth circuit coupled between a connection node of the impedance matching circuit and a ground reference node, wherein the video bandwidth circuit includes
      an envelope inductor and an envelope capacitor coupled in series between the connection node and the ground reference node,
      a first bypass capacitor coupled in parallel across the envelope inductor, wherein the envelope inductor and the first bypass capacitor form a parallel resonant circuit in proximity to a center operating frequency of the amplifier,
      an envelope resistor coupled in series with the envelope inductor and the envelope capacitor and
      a second bypass capacitor coupled in parallel across the envelope resistor.

4. A radio frequency (RF) amplifier comprising:
   a transistor, wherein the transistor has a control terminal and first and second current carrying terminals;
   an output impedance matching circuit coupled to the first current carrying terminal, wherein the output impedance matching circuit includes a shunt circuit coupled between the first current carrying terminal and the ground reference node, wherein the shunt circuit includes a shunt inductance and a shunt capacitor coupled in series, and wherein an RF cold point node is present between the shunt inductance and the shunt capacitor; and
   a video bandwidth circuit coupled between the RF cold point node and a ground reference node, wherein the video bandwidth circuit includes an envelope resistor, an envelope capacitor, and an envelope resistor coupled in series between the RF cold point node and the ground reference node, and wherein the video bandwidth circuit further includes a first bypass capacitor with a first capacitor terminal coupled to a first terminal of the envelope resistor, and a second capacitor terminal coupled to a second terminal of the envelope resistor, so that the first bypass capacitor is coupled in parallel across the envelope resistor.

5. A packaged radio frequency (RF) amplifier device comprising:
   a device substrate;
   an RF output lead coupled to the device substrate;
   a transistor coupled to the device substrate, wherein the transistor has a control terminal and first and second current carrying terminals;
   an output impedance matching circuit coupled between the first current carrying terminal and the RF output lead, wherein the output impedance matching circuit includes a shunt circuit coupled between the first current carrying terminal and the ground reference node, wherein the shunt circuit includes a shunt inductance and a shunt capacitor coupled in series, and wherein an RF cold point node is present between the shunt inductance and the shunt capacitor; and
   a video bandwidth circuit coupled between the RF cold point node and the ground reference node, wherein the video bandwidth circuit includes an envelope inductor, an envelope resistor, and an envelope capacitor coupled in series between the RF cold point node and the ground reference node, and wherein the video bandwidth circuit further includes a first bypass capacitor with a first capacitor terminal coupled to a first terminal of the envelope inductor, and a second capacitor terminal coupled to a second terminal of the envelope inductor.

6. The device of claim 5, wherein the first bypass capacitor is coupled in parallel across the envelope inductor, and wherein the envelope inductor and the first bypass capacitor form a parallel resonant circuit in proximity to a center operating frequency of the amplifier.

7. A packaged radio frequency (RF) amplifier device comprising:
   a device substrate;
   a plurality of RF input/output (I/O) leads coupled to the device substrate;
   a transistor coupled to the device substrate;
   an impedance matching circuit electrically coupled between the transistor and one of the RF I/O leads; and
   a video bandwidth circuit electrically coupled between a connection node of the impedance matching circuit and a ground reference node, wherein the video bandwidth circuit includes
      an envelope inductor and an envelope capacitor coupled in series between the connection node and the ground reference node,
      a first bypass capacitor coupled in parallel across the envelope inductor, and wherein the envelope inductor and the first bypass capacitor form a parallel resonant circuit in proximity to a center operating frequency of the amplifier,
      an envelope resistor coupled in series with the envelope inductor and the envelope capacitor and
      a second bypass capacitor coupled in parallel across the envelope resistor.

8. A packaged radio frequency (RF) amplifier device comprising:
   a device substrate;
   an RF output lead coupled to the device substrate;
   a transistor coupled to the device substrate, wherein the transistor has a control terminal and first and second current carrying terminals;
   an output impedance matching circuit coupled between the first current carrying terminal and the RF output lead, wherein the output impedance matching circuit includes a shunt circuit coupled between the first current carrying terminal and the ground reference node, wherein the shunt circuit includes a shunt inductance and a shunt capacitor coupled in series, and wherein an RF cold point node is present between the shunt inductance and the shunt capacitor; and
   a video bandwidth circuit coupled between the RF cold point node and a ground reference node, wherein the video bandwidth circuit includes an envelope resistor, an envelope capacitor, and an envelope resistor coupled in series between the RF cold point node and the ground reference node, and wherein the video bandwidth circuit further includes a first bypass capacitor with a first capacitor terminal coupled to a first terminal of the envelope resistor, and a second capacitor terminal coupled to a second terminal of the envelope resistor, so that the first bypass capacitor is coupled in parallel across the envelope resistor.

9. The device of claim 5, further comprising:
   a passive device substrate coupled to the device substrate, wherein the passive device substrate includes a first conductive pad corresponding to the RF cold point node, and a second conductive pad that is electrically coupled to a first terminal of the envelope capacitor, wherein the first and second conductive pads are exposed at a surface of the passive device substrate, the envelope inductor is coupled between the first and second conductive pads, and the bypass capacitor also is coupled between the first and second conductive pads, and wherein the envelope inductor is selected from a plurality of bondwires and an integrated inductor.

10. The RF amplifier of claim 8, wherein the envelope inductor is selected from a plurality of bondwires and an integrated inductor.

11. A method of manufacturing an RF amplifier device, the method comprising the steps of:
   coupling a transistor to a device substrate, wherein the transistor has a control terminal and first and second current carrying terminals;
   coupling an RF output to the device substrate;
   electrically coupling an impedance matching circuit between the first current carrying terminal and the RF output lead, wherein the impedance matching circuit includes a shunt circuit coupled between the first current carrying terminal and a ground reference node, wherein the shunt circuit includes a shunt inductance and a shunt capacitor coupled in series, and wherein an RF cold point node is present between the shunt inductance and the shunt capacitor; and
   electrically coupling a video bandwidth circuit between the RF cold point node of the impedance matching circuit and the ground reference node, wherein the video bandwidth circuit includes an envelope inductor, an envelope resistor, and an envelope capacitor coupled in series between the RF cold point node and the ground reference node, and wherein the video bandwidth circuit further includes a bypass capacitor with a first capacitor terminal coupled to a first terminal of the envelope inductor, and a second capacitor terminal coupled to a second terminal of the envelope inductor so that the bypass capacitor is coupled in parallel across the envelope inductor.

12. The method of claim 11, wherein the bypass capacitor is coupled in parallel across the envelope inductor, and wherein the envelope inductor and the bypass capacitor form a parallel resonant circuit in proximity to a center operating frequency of the amplifier.

* * * * *